(12) United States Patent  (10) Patent No.: US 8,053,536 B2
Chichak et al.  (45) Date of Patent: Nov. 8, 2011

(54) FUNCTIONALIZED POLYFLUORENES FOR USE IN OPTOELECTRONIC DEVICES

(75) Inventors: Kelly Scott Chichak, Clifton Park, NY (US); Larry Neil Lewis, Scotia, NY (US); James Anthony Cella, Clifton Park, NY (US); Joseph John Shiang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 580 days.

(21) Appl. No.: 12/328,805

(22) Filed: Dec. 5, 2008

(65) Prior Publication Data
US 2010/0144976 A1 Jun. 10, 2010

(51) Int. Cl.
C08G 61/00 (2006.01)
C08L 65/00 (2006.01)
H01L 33/00 (2010.01)

(52) U.S. Cl. ............ 525/540; 257/79; 525/50; 528/394

(58) Field of Classification Search .................. None
See application file for complete search history.

(56) References Cited

U.S. PATENT DOCUMENTS

| 7,608,677 | B2* | 10/2009 | Cella et al. | 528/196 |
|---|---|---|---|---|
| 7,695,640 | B2* | 4/2010 | Chichak et al. | 252/301.35 |
| 7,718,277 | B2* | 5/2010 | Chichak et al. | 428/690 |
| 7,793,126 | B2* | 9/2010 | McGrane et al. | 713/320 |
| 7,830,081 | B2* | 11/2010 | Lewis et al. | 313/504 |
| 2006/0063026 | A1* | 3/2006 | Holmes et al. | 428/690 |
| 2007/0225464 | A1 | 9/2007 | Lewis et al. | |
| 2011/0108807 | A1* | 5/2011 | Ye et al. | 257/40 |

FOREIGN PATENT DOCUMENTS

| JP | 2003238724 | 8/2003 |
|---|---|---|
| JP | 28056727 | 3/2008 |
| WO | WO2008014037 A2 | 1/2008 |
| WO | WO2008069586 | 6/2008 |
| WO | WO2009079039 A1 | 6/2009 |

OTHER PUBLICATIONS

Sek et al., "Hole Transport Triphenylamine—Azomethine Conjugated System: Synthesis and Optical, Photoluminescence, and Electromechanical Properties", Macromolecules, 2008, 41, 6653-6663.
El-Khouly et al., "Comparative study of the Bimolecular Electron Transfer of Fullerenes (C60/C70) and 9,9-disubstituted Fluorenes by Laser Flash Photolysys", Photochemical & Photobiological Sciences, (2007) pp. 539-544.
Jin et al., "Improved Properties of Polyfluorenevinylenes by Introduction of Carbazole Units", Journal of Polymer Science, Part A, Polymer Chemistry (2008), 46 (13), pp. 4407-4419.

* cited by examiner

Primary Examiner — Robert Sellers
(74) Attorney, Agent, or Firm — Eileen B. Gallagher

(57) ABSTRACT

The present invention relates to process comprising reacting a polyfluorenes comprising at least one structural group of formula I

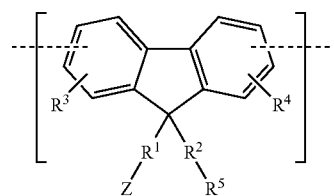

I with an iridium (III) compound of formula II

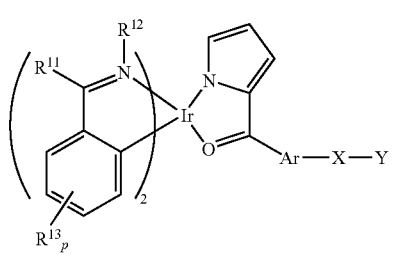

II wherein
$R^1$ and $R^2$ are independently alkyl, substituted alkyl, aryl, substituted aryl or a combination thereof;
$R^5$ is H or CHO;
$R^3$ and $R^4$ are independently hydrogen, alkyl, substituted alkyl, aryl, substituted aryl or a combination thereof;
$R^{11}$ and $R^{12}$ taken together form a substituted or unsubstituted monocyclic or bicyclic heteroaromatic ring;
$R^{13}$ is independently at each occurrence halo, nitro, hydroxy, amino, alkyl, aryl, arylalkyl, alkoxy, substituted alkoxy, substituted alkyl, substituted aryl, or substituted arylalkyl;
Ar is aryl, heteroaryl, substituted aryl, substituted heteroaryl, or a combination thereof;
X is selected from a direct bond, alky, substituted alkyl, and combinations thereof;
Y is CHO or $NH_2$;
Z is CHO or $NH_2$ where Z does not equal Y; and
p is 0, 1 or 2.
The invention also relates to the polyfluorenes, which are products of the reaction, and the use of the polyfluorenes in optoelectronic devices.

15 Claims, 1 Drawing Sheet

FUNCTIONALIZED POLYFLUORENES FOR USE IN OPTOELECTRONIC DEVICES

STATEMENT REGARDING FEDERALLY SPONSORED RESEARCH AND DEVELOPMENT

This invention was made with Government support under contract number DOE NETL DE-FC26-05NT42343 awarded by the U.S. Department of Energy. The Government may have certain rights in the invention.

BACKGROUND

Organic light emitting devices (OLEDs), which make use of thin film organic materials that emit light when subjected to a voltage bias, are expected to become an increasingly popular form of flat panel display technology. Potential applications include cellphones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs may replace incandescent, and perhaps even fluorescent, lamps for certain types of applications.

Light emission from OLEDs typically occurs via electrofluorescence, i.e. light emission from a singlet-excited state formed by applying a voltage bias across a ground state electroluminescent material. It is believed that OLEDs capable of producing light by an alternate mechanism, electrophosphorescence, i.e. light emission from a triplet excited state formed by applying a voltage bias across a ground state electrofluorescecent material, will exhibit substantially higher quantum efficiencies than OLEDs that produce light primarily by electrofluorescence. Light emission from OLEDs by electrophosphorescence is limited since the triplet excited states in most light emitting organic materials are strongly disposed to non-radiative relaxation to the ground state. Thus, electrophosphorescent materials hold promise as key components of OLED devices and other optoelectronic devices exhibiting greater efficiencies relative to the current state of the art. For example, OLEDs capable of light production by electrophosphorescence are expected to exhibit a reduction (relative to OLEDs which produce light primarily by electrofluorescence) in the amount of energy lost to radiationless decay processes within the device thereby providing an additional measure of temperature control during operation of the OLED.

Improved light emission efficiencies have been achieved by incorporating a phosphorescent platinum-containing dye in an organic electroluminescent device such as an OLED (Baldo et al., "Highly Efficient Phosphorescent Emission from Organic Electroluminescent Devices", Nature, vol. 395, 151-154, 1998) and phosphorescent iridium-containing dyes have also been employed (US 2003/0096138). Polymerizable phosphorescent iridium complexes based on a ketopyrrole ligand are disclosed in pending U.S. application Ser. No. 11/504,552, filed on 14 Aug. 2006, which claims priority from U.S. provisional application, Ser. No. 60/833,935, filed on 28 Jul. 2006, the entire contents of which are incorporated by reference in their entirety.

Notwithstanding earlier developments, there is currently considerable interest in finding novel phosphorescent materials, which increase efficiency and provide for a greater measure of control of the color of light produced by an OLED, while achieving improved lifetime of the devices.

BRIEF DESCRIPTION

In one aspect, the present invention relates to process comprising reacting a polyfluorenes comprising at least one structural group of formula I

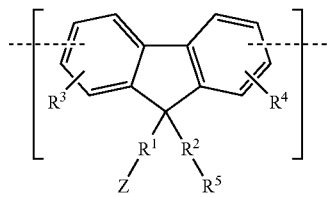

with an iridium (III) compound of formula II

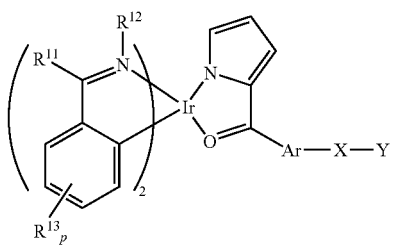

wherein
$R^1$ and $R^2$ are independently alkyl, substituted alkyl, aryl, substituted aryl or a combination thereof;
$R^5$ is H or CHO;
$R^3$ and $R^4$ are independently hydrogen, alkyl, substituted alkyl, aryl, substituted aryl or a combination thereof;
$R^{11}$ and $R^{12}$ taken together form a substituted or unsubstituted monocyclic or bicyclic heteroaromatic ring;
$R^{13}$ is independently at each occurrence halo, nitro, hydroxy, amino, alkyl, aryl, arylalkyl, alkoxy, substituted alkoxy, substituted alkyl, substituted aryl, or substituted arylalkyl;
Ar is aryl, heteroaryl, substituted aryl, substituted heteroaryl, or a combination thereof;
X is selected from a direct bond, alky, substituted alkyl, and combinations thereof;
Y is CHO or $NH_2$;
Z is CHO or $NH_2$ where Z does not equal Y; and
p is 0, 1 or 2.

In another aspect, the present invention relates to polyfluorenes that may be prepared by the process of the present invention. The polyfluorenes include at least one structural group of formula V

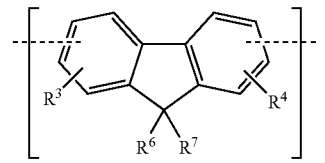

wherein
R⁶ is a group of formula VI

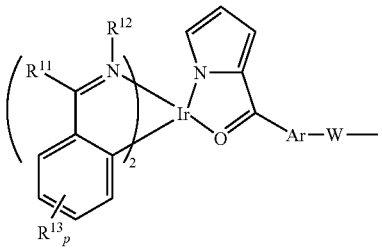

VI

R³, R⁴ and R⁷ are independently hydrogen, alkyl, substituted alkyl, aryl substituted aryl, and combinations thereof; and R¹¹ and R¹² taken together form a substituted or unsubstituted monocyclic or bicyclic heteroaromatic ring;

R¹³ is independently at each occurrence halo, nitro, hydroxy, amino, alkyl, aryl, arylalkyl, alkoxy, substituted alkoxy, substituted alkyl, substituted aryl, or substituted arylalkyl;

Ar is aryl, heteroaryl, substituted aryl, substituted heteroaryl, or a combination thereof;

W is —X'—NH—Y'—, —X'—N=Y"—, —X"=N—Y'—, or a combination thereof;

X' is selected from a direct bond, alkylene, substituted alkylene, or combinations thereof;

Y' is alkylene, substituted alkylene, arylene, substituted arylene, oxaalkylene, substituted oxaalkylene, or a combination thereof;

X" is alkylidene, substituted alkylidene, or a combination thereof;

Y" is alkylidene, substituted alkylidene, arylidene, substituted arylidene, or a combination thereof, and p is 0, 1 or 2.

In another aspect of the present invention relates to organic optoelectronic devices having at least one layer comprising a polyfluorene having at least one structural group of formula V.

DETAILED DESCRIPTION

Figure 1:
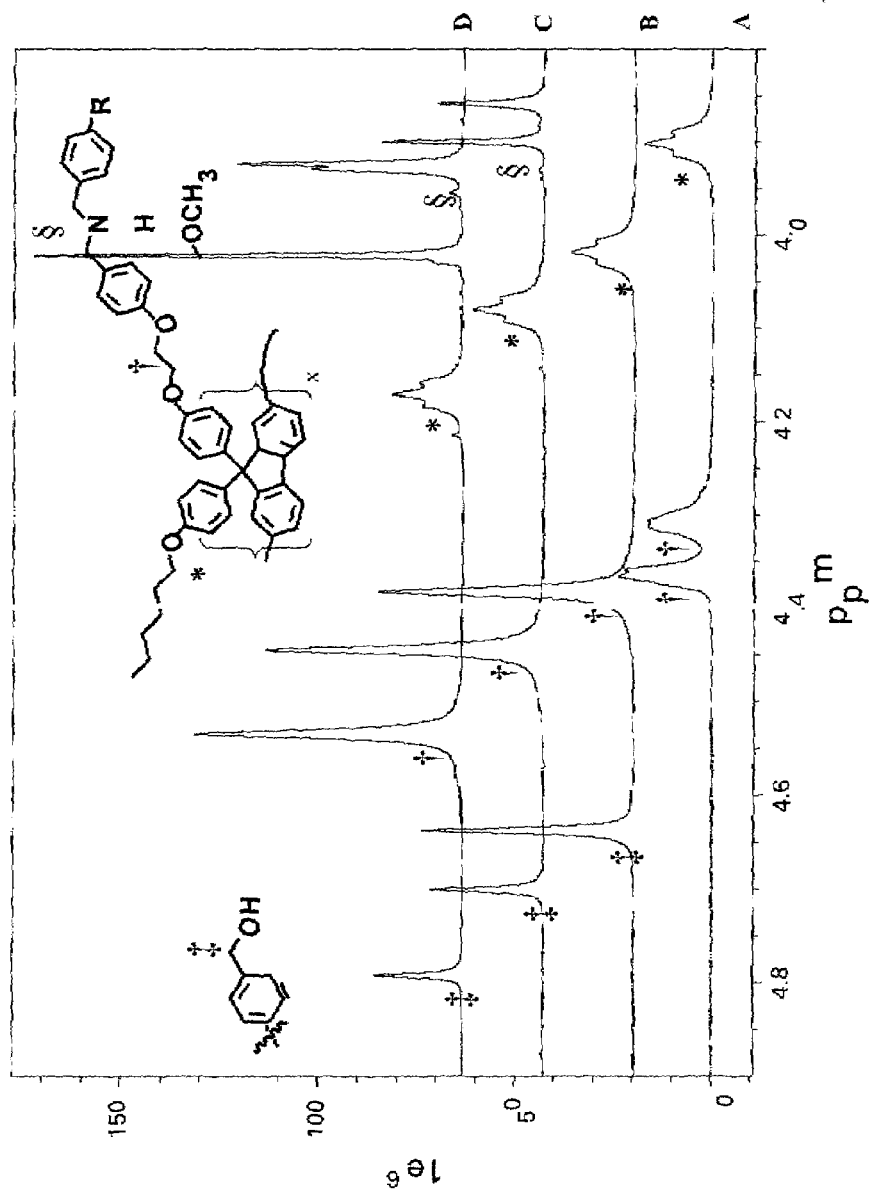
FIG. 1 shows the ¹H NMR spectra (500 MHz) of polyfluorenes with pendant aldehyde substituents through reaction with primary amines and subsequent reduction.

To more clearly and concisely describe and point out the subject matter of the claimed invention, the following definitions are provided for specific terms, which are used in the following description and the appended claims.

"Aryl" and "heteroaryl" mean a 5- or 6-membered aromatic or heteroaromatic ring containing 0-3 heteroatoms selected from nitrogen, oxygen or sulfur; a bicyclic 9- or 10-membered aromatic or heteroaromatic ring system containing 0-3 heteroatoms selected from nitrogen, oxygen or sulfur; or a tricyclic 13- or 14-membered aromatic or heteroaromatic ring system containing 0-3 heteroatoms selected from nitrogen, oxygen or sulfur. The aromatic 6- to 14-membered carbocyclic rings include, for example, benzene, naphthalene, indane, tetralin, and fluorene; and the 5- to 10-membered aromatic heterocyclic rings include, e.g., imidazole, pyridine, indole, thiophene, benzopyranone, thiazole, furan, benzimidazole, quinoline, isoquinoline, quinoxaline, pyrimidine, pyrazine, tetrazole and pyrazole. Arylene refers to a radical that is bivalent and formed by removal of hydrogen from two carbon sites on an aromatic nucleus. Arylidene refers to an alkylidene unit substituted with an aryl group.

"Arylalkyl" means an alkyl residue attached to an aryl ring. Examples are benzyl and phenethyl. Heteroarylalkyl means an alkyl residue attached to a heteroaryl ring. Examples include pyridinylmethyl and pyrimidinylethyl. Alkylaryl means an aryl residue having one or more alkyl groups attached thereto. Examples are tolyl and mesityl.

"Alkoxy" or "alkoxyl" refers to groups of from 1 to 8 carbon atoms of a straight, branched, cyclic configuration and combinations thereof attached to the parent structure through an oxygen. Examples include methoxy, ethoxy, propoxy, isopropoxy, cyclopropyloxy, and cyclohexyloxy. Lower alkoxy refers to groups containing one to four carbons.

"Acyl" refers to groups of from 1 to 8 carbon atoms of a straight, branched, cyclic configuration, saturated, unsaturated and aromatic and combinations thereof, attached to the parent structure through a carbonyl functionality. One or more carbons in the acyl residue may be replaced by nitrogen, oxygen or sulfur as long as the point of attachment to the parent remains at the carbonyl. Examples include acetyl, benzoyl, propionyl, isobutyryl, t-butoxycarbonyl, and benzyloxycarbonyl. Lower-acyl refers to groups containing one to four carbons.

"Heterocyclic" means a cycloalkyl or aryl residue in which one to two of the carbons are replaced by a heteroatom such as oxygen, nitrogen or sulfur. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, and tetrahydrofuran.

"Substituted" refers to residues, including, but not limited to, alkyl, alkylaryl, aryl, arylalkyl, and heteroaryl, wherein up to three H atoms of the residue are replaced with lower alkyl, substituted alkyl, aryl, substituted aryl, haloalkyl, alkoxy, carbonyl, carboxy, carboxalkoxy, carboxamido, acyloxy, amidino, nitro, halo, hydroxy, OCH(COOH)₂, cyano, primary amino, secondary amino, acylamino, alkylthio, sulfoxide, sulfone, phenyl, benzyl, phenoxy, benzyloxy, heteroaryl, or heteroaryloxy.

"Haloalkyl" refers to an alkyl residue, wherein halogen atoms replace one or more hydrogen atoms; the term haloalkyl includes perhaloalkyl. Examples of haloalkyl groups that fall within the scope of the invention include $CH_2F$, $CHF_2$, and $CF_3$.

"Oxaalkyl" refers to an alkyl residue in which one or more carbons have been replaced by oxygen. It is attached to the parent structure through an alkyl residue. Examples include methoxypropoxy, 3,6,9-trioxadecyl and the like. The term oxaalkyl refers to compounds in which the oxygen is bonded via a single bond to its adjacent atoms (forming ether bonds); it does not refer to doubly bonded oxygen, as would be found in carbonyl groups. Similarly, thiaalkyl and azaalkyl refer to alkyl residues in which one or more carbons has been replaced by sulfur or nitrogen, respectively. Examples include ethylaminoethyl and methylthiopropyl.

Many of the compounds described herein may contain one or more asymmetric centers and may thus give rise to enantiomers, diastereomers, and other stereoisomeric forms that may be defined, in terms of absolute stereochemistry, as (R)— or (S)—. The present invention is meant to include all such possible isomers, as well as, their racemic and optically pure forms. Optically active (R)— and (S)—isomers may be prepared using chiral synthons or chiral reagents, or resolved using conventional techniques. When the compounds described herein contain olefinic double bonds or other centers of geometric asymmetry, and unless specified otherwise, it is intended that the compounds include both E and Z geometric isomers. Likewise, all tautomeric forms are also intended to be included.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values, which are less than one, one unit is considered to be 0.0001, 0.001, 0.01 or 0.1 as appropriate These are only examples of what is specifically intended and all possible combinations of numerical values between the lowest value and the highest value enumerated are to be considered to be expressly stated in this application in a similar manner.

In one aspect, the present invention related to a process of making a polyfluorene by imine condensation of a pendant aldehyde group located on a polyfluorene backbone with a primary amine followed by reduction. Dynamic covalent chemistry may be employed in the initial imine bond formation; imine bond formation is a reversible thermodynamic reaction. Subsequent reduction of the imine to the corresponding amine provides an amine-functionalized polyfluorene.

In particular embodiments, the process involves an imine condensation reaction of a polyfluorene containing structural units of formula I and one or more iridium (III) compounds of formula II.

Iridium (III) compounds of formula II suitable for attaching through an amine group have been described in U.S. patent application Ser. No. 11/504,871, filed 16 Aug. 2006, Ser. No. 11/506,002, filed 17 Aug. 2006, Ser. No. 1/506,001, filed 17 Aug. 2006, Ser. No. 11/507,051, filed 18 Aug. 2006, Ser. No. 11/599,972, filed 15 Nov. 2006, Ser. No. 11/637,582, filed 12 Dec. 2006, Ser. No. 11/504,552, filed 14 Aug. 2006, Ser. No. 11/504,870 filed 16 Aug. 2006, Ser. No. 11/504,084 filed 14 Aug. 2006, all of which claim priority from U.S. Provisional Application Ser. No. 60/833,935, filed 28 Jul. 2006. The entire contents of the above patent applications are incorporated herein by reference. The iridium (III) compounds contain an additional emissive element, triplet emitting Iridium (III) complexes with ancillary pyrrole ligands.

In certain embodiments $R^1$ of formula I may be an oxaalkylene, substituted oxaalkylene, and combinations thereof. In certain embodiments $R^1$ is

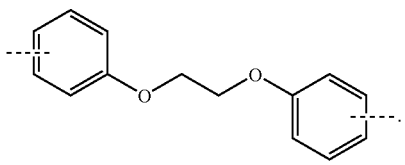

In still other embodiments, $R^{11}$ and $R^{12}$ of formula II, taken together form a substituted or unsubstituted isoquinoline.

The imine condensation between the polyfluorene and the one or more iridium (III) compounds may occur simultaneously or sequentially. Reduction of the resulting imine occurs using a reducing agent, such as sodium borohydride ($NaBH_4$).

In certain embodiments, the process further involves the reaction of the polyfluorene of formula I with one more triarylamines. In particular the triarylamine may be a compound of formula III

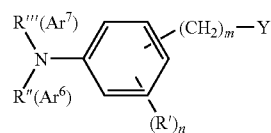

III wherein
R" and R'" are independently hydrogen, alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, taken together a heterocyclic ring or a combination thereof;

$Ar^6$ and $Ar^7$ are independently aryl, heteroaryl, substituted aryl, substituted heteroaryl, or a combination thereof;

R' is an alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof; m is an integer from 0 to 10;

n is an integer from 0 to 4; and
Y is CHO or $NH_2$ and does not equal Z of formula I.
In certain embodiments R" and R'" of the compound of formula III are hydrogen, and m is equal to 0.

In other embodiments, the triarylamine may be a compound of formula IV

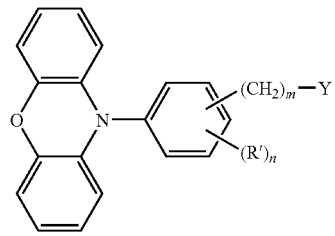

IV wherein
R' is an alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;
m is an integer from 0 to 10;
n is an integer from 0 to 4; and
Y is CHO or $NH_2$ and does not equal Z of formula I.
In certain embodiments, m and n of formula IV are equal to 0.

The imine condensation between the polyfluorene, the one or more iridium (III) compounds, and the one or more triarylamines may occur simultaneously, such that the iridium (III) compound and the triarylamine are added in a single step to the polyfluorene, or sequentially such that the iridium (III)

compound and triarylamine are added in separate steps to the polyfluorene. Reduction of the resulting imine occurs using a reducing agent, such as sodium borohydride (NaBH4). The reduction step may also occur simultaneously or sequentially.

More particularly, the process may result in a polyfluorenes wherein the weight percentage of a iridium (III) compound containing group to a triarylamine containing group may be from about 0.5 to about 50 mol %. This provides a polymer with both the triarylamine and the iridium III) compound in the polymer backbone and allows attenuation of the emissive and transport properties of the polyfluorene material.

Suitable triarylamines are described in U.S. Pat. Nos. 5,728,801, 5,929,194, 5,948,552, 6,309,763, 6,605,373, 6,900,285, WO 2004/060970, WO 2005/049546 and WO 2005/052027, to Dow Global Technologies, the entire contents of which are incorporated by reference Polyfluorenes for use in the processes of the present invention may include structural units in addition to those of formula I, such as unsubstituted fluorenyl units and/or fluorenyl units substituted with saturated groups such as alkyl. Other structural units may be derived from conjugated compounds as described in U.S. Pat. No. 6,900,285. In particular, structural units derived from tertiary aromatic amines may be used as described in U.S. Pat. Nos. 5,948,552, 6,605,373, and 6,916,902. The amount of structural units derived from unsaturated monomers ranges from about 0.05 mol % to about 50 mol %, particularly from about 1 mol % to about 25 mol %, and more particularly from about 1 mol % to about 10 mol %.

The polyfluorenes may be prepared by methods known in the art for making polyfluorenes, including Suzuki coupling of the appropriate dihalide and diboronate/diboronic acid and Yamamoto coupling. U.S. Pat. Nos. 5,708,130; 6,169,163; 6,512,083; and 6,900,285 describe synthesis of polymers containing fluorene subunits.

In one aspect, the present invention relates to a polyfluorene produced by a method of imine condensation of a pendant aldehyde group located on a polyfluorene backbone with a primary amine followed by reduction. In another aspect, the present invention relates to a polyfluorenes produced by a method of imine condensation of a pendant primary amine group located on a polyfluorenes backbone with an aldehyde followed by reduction. In both aspects, Dynamic covalent chemistry may be employed in the initial imine bond formation; imine bond formation is a reversible thermodynamic reaction. Subsequent reduction of the imine to the corresponding amine provides an amine-functionalized polyfluorene.

In particular embodiments, the polyfluorene thus formed comprises at least one structural group of formula V.

Iridium (III) compounds suitable for attaching to the polyfluorenes through a secondary amino group have been described in U.S. patent application Ser. No. 11/504,871, filed 16 Aug. 2006, Ser. No. 11/506,002, filed 17 Aug. 2006, Ser. No. 1/506,001, filed 17 Aug. 2006, Ser. No. 11/507,051, filed 18 Aug. 2006, Ser. No. 11/599,972, filed 15 Nov. 2006, Ser. No. 11/637,582, filed 12 Dec. 2006, Ser. No. 11/504,552, filed 14 Aug. 2006, Ser. No. 11/504,870 filed 16 Aug. 2006, Ser. No. 11/504,084 filed 14 Aug. 2006, all of which claim priority from U.S. Provisional Application Ser. No. 60/833, 935, filed 28 Jul. 2006. The entire contents of the above patent applications are incorporated herein by reference. The iridium (III) compounds contain an additional emissive element, triplet emitting Iridium (III) complexes with ancillary pyrrole ligands.

In certain embodiments, Y' is oxaalkylene, substituted oxaalkylene, or a combination thereof. In certain embodiments, Y' is

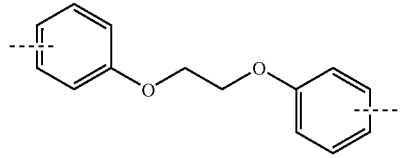

In still other embodiments, $R^{11}$ and $R^{12}$ of the iridium (III) compound of formula VI, when taken together, may form a substituted or unsubstituted isoquinoline.

Polyfluorenes of the present invention may additionally comprise at least one triarylamine substituted group. In particular embodiments, the group is a compound of formula VII

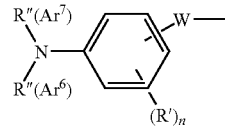

VII wherein

R" and R'" are independently hydrogen, alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, taken together a heterocyclic ring or a combination thereof;

$Ar^6$ and $Ar^7$ are independently aryl, heteroaryl, substituted aryl, substituted heteroaryl, or a combination thereof;

R' is an alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;

W is —X'—NH—Y'—, —X'—N═Y"—, —X"═N—Y'—, or a combination thereof;

X' is selected from a direct bond, alkylene, substituted alkylene, or combinations thereof;

Y' is alkylene, substituted alkylene, arylene, substituted arylene, oxaalkylene, substituted oxaalkylene, or a combination thereof;

X" is alkylidene, substituted alkylidene, or a combination thereof;

Y" is alkylidene, substituted alkylidene, arylidene, substituted arylidene, or a combination thereof, and n is an integer from 0 to 4.

In certain embodiments $R^3$ and $R^4$ of formula V are hydrogen and n is 0. In certain embodiments, the triarylamine is connected to the polyfluorene according to Formula VII where Y' is oxaalkylene, substituted oxaalkylene, and combinations thereof. In certain embodiments Y' is

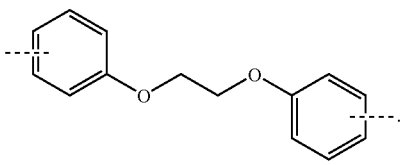

In particular embodiments the $R^6$ group of formula V additionally includes at least one triarylamine substituted group of formula VIII

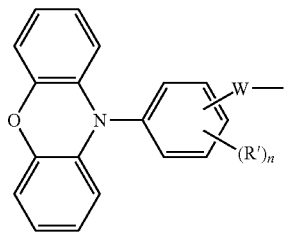

VIII wherein

R' is an alkyl, substituted alkyl, alkenyl, alkynyl, substituted alkenyl, substituted alkynyl, alkyloxy, substituted alkoxy, alkenoxy, alkynoxy, substituted alkenoxy, substituted alkynoxy, or a combination thereof;

W is —X'—NH—Y'—, —X'—N=Y"—, —X"=N—Y'—, or a combination thereof;

X' is selected from a direct bond, alkylene, substituted alkylene, or combinations thereof;

Y' is alkylene, substituted alkylene, arylene, substituted arylene, oxaalkylene, substituted oxaalkylene, or a combination thereof;

X" is alkylidene, substituted alkylidene, or a combination thereof;

Y" is alkylidene, substituted alkylidene, arylidene, substituted arylidene, or a combination thereof, and n is an integer from 0 to 4.

In certain embodiments $R^3$ and $R^4$ of formula V are hydrogen. In certain other embodiments, the triarylamine is connected to the polyfluorene according to Formula VIII where Y' is an oxaalkylene, substituted oxaalkylene, and combinations thereof. In certain embodiments Y' is

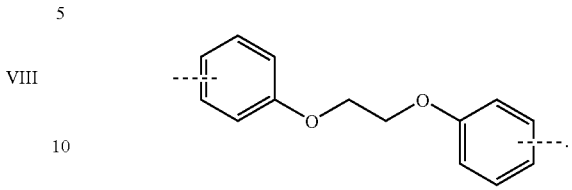

In the polyfluorenes of the present invention, the weight percentage of an iridium (III) compound to a triarylamine substituted secondary amine may be from about 0.5 to about 50 mol %. This provides a polymer with both the triaryl amine and the iridium (III) compound in the polymer backbone and allows attenuation of the emissive and transport properties of the polyfluorene material.

In certain embodiments the polyfluorene may further contain unsubstituted fluorenyl units and/or fluorenyl units substituted with saturated groups such as alkyl. Other structural units may be derived from conjugated compounds as described in U.S. Pat. No. 6,900,285. In particular, structural units derived from tertiary aromatic amines may be used as described in U.S. Pat. Nos. 5,948,552, 6,605,373, and 6,916,902. The amount of structural units derived from unsaturated monomers ranges from about 0.05 mol % to about 50 mol %, particularly from about 1 mol % to about 25 mol %, and more particularly from about 1 mol % to about 10 mol %.

The polyfluorenes may be prepared by methods known in the art for making polyfluorenes, including Suzuki coupling of the appropriate dihalide and diboronate/diboronic acid and Yamamoto coupling. U.S. Pat. Nos. 5,708,130; 6,169,163; 6,512,083; and 6,900,285 describe synthesis of polymers containing fluorene subunits.

In a preferred embodiment the polyfluorenes may comprise structural units of formula IX

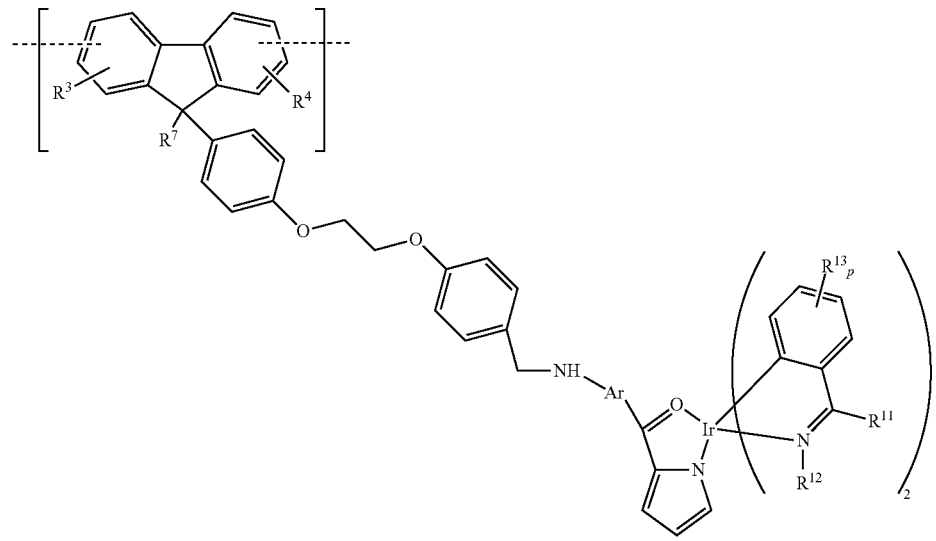

IX wherein

R³, R⁴ and R⁷ are independently hydrogen, alkyl, substituted alkyl, aryl substituted aryl, and combinations thereof;

R¹¹ and R¹² taken together form a substituted or unsubstituted monocyclic or bicyclic heteroaromatic ring;

R¹³ is independently at each occurrence halo, nitro, hydroxy, amino, alkyl, aryl, arylalkyl, alkoxy, substituted alkoxy, substituted alkyl, substituted aryl, or substituted arylalkyl; and Ar is aryl, heteroaryl, substituted aryl, substituted heteroaryl, or a combination thereof.

In certain embodiments, the polyfluorenes may further comprising structural units of formula X

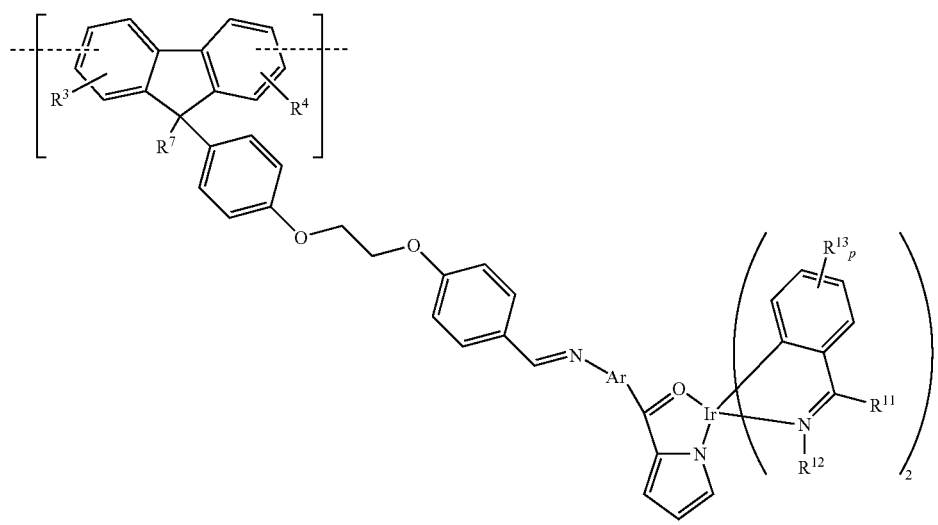

In certain embodiments, the polyfluorenes may further comprising structural units of formula XI

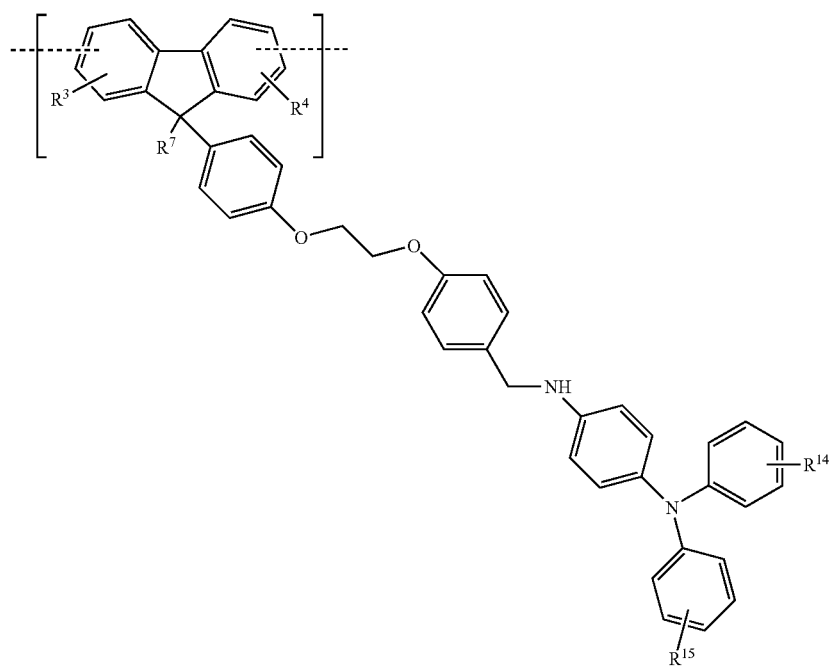

wherein $R^3$, $R^4$ and $R^7$ are independently hydrogen, alkyl, substituted alkyl, aryl substituted aryl, and combinations thereof; and $R^{14}$ and $R^{15}$ are independently hydrogen, alkyl, substituted alkyl and combinations thereof.

In another embodiment the polyfluorenes may further comprising structural units of formula XII

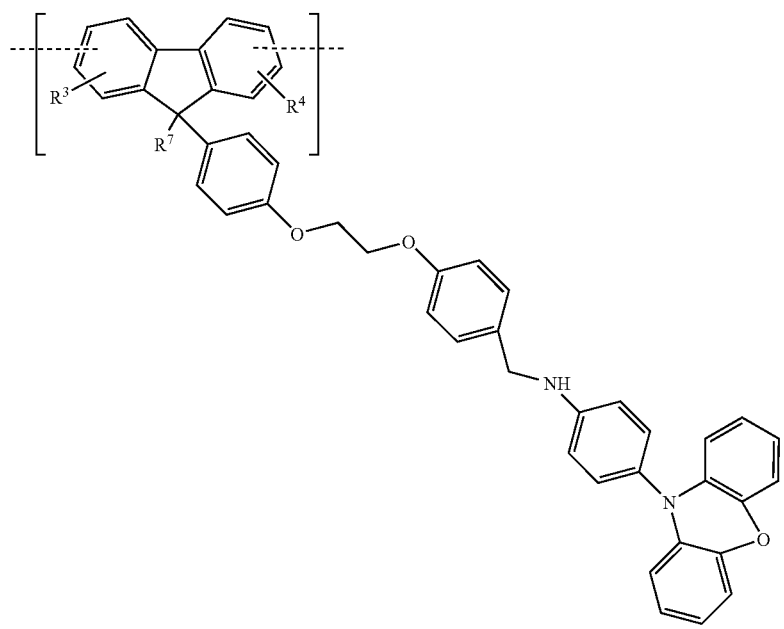

XII wherein $R^3$, $R^4$ and $R^9$ are independently hydrogen, alkyl, substituted alkyl, aryl substituted aryl, and combinations thereof.

In another aspect, the invention relates to optoelectronic devices containing the functionalized polyfluorenes in one or more light emissive layers. The polyfluorene of Formula I may be blended with fluorescent emitting materials such as (co)polymers based on fluorene monomers, for example, F8-TFB, commercially available emissive polymers such as ADS131BE, ADS231BE, ADS331BE, ADS431BE, ADS429BE, ADS160BE, ADS329BE, ADS229BE, ADS129BE, ADS180BE, supplier by American Dye Sources, and BP105 and BP361, available from Sumation Company Ltd. Other materials useful for blending with the polymers of the present invention include molecular and oligomeric species such as fluorene trimers and their derivatives, polymeric or molecular triarylamine materials, including those described in U.S. Pat. Nos. 3,265,496 and 4,539,507, and commercially available triarylamines available from American Dye Sources, such as ADS254BE, ADS12HTM, and ADS04HTM, substituted polyphenylene polymers, such ADS120BE from American Dye Sources, and polymers having oligomeric units connected via non-conjugated linking groups, as described in US 2005/0256290.

It is preferable that when blending the functionalized polyfluorenes of the present invention with other materials, that the lowest triplet energy level of the other materials (as measured by photoluminescence or other technique) be greater that the triplet energy of the pendent Iridium-based emitter of the polymers of the present invention. In particular, polymers may be blended with one or more fluorescent materials such as blue-emitting fluorene (co)polymers, as these typically have a lowest triplet energy below that of the lowest emissive single energy of the polymers of the present invention and exhibit blue emission.

The functionalized polyfluorenes of the present invention and/or blends of the amine-functionalized polyfluorenes with blue-emitting fluorene (co)polymers may be contained in a light emitting layer of the device disposed adjacent to another light emitting layer containing one or more fluorene polymers or copolymers such as BP105 or F8-TFB to form an bilayer structure. In these devices, the bilayer structure may be formed by via several different means, as described in PCT/US07/68620. For example, following deposition of the first layer, the bilayer may be insolublized via a thermal treatment alone, or via the inclusion within the first layer of a cross-linkable polymerization agent to link the polymer chains together or form an interpenetrating network. The polymerization may be initiated via UV irradiation or thermal activation. The polymerization processing may be enhanced through the addition of a small amount of an initiator such as IRGACURE® 754, the ESACURE® initiators from Sartomer, BPO, or AIBN. Alternatively, the layer structure may be formed by applying the second layer from a solvent that does not dissolve the first layer, through contact lamination (Ramsdale et al. J. Appl. Phys, vol 92, pg. 4266 (2002)), or through vapor deposition. If desired, these methods maybe applied serially to produce a multilayer structure in which one or more of the layers includes one or more of the polymers of the present invention.

Optoelectronic device according to the present invention may additionally include at least one photoluminescent ("PL") material optically coupled with the polymer such that the phosphor material absorbs a portion of EM radiation emitted thereby and emits EM radiation in a third wavelength range. Materials for use as the PL material and exemplary device structures containing PL materials are described in U.S. Pat. No. 7,063,900, the entire contents of which are incorporated by reference.

An opto-electronic device, exemplified by an organic light emitting device, typically contains multiple layers which include, in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay. Triplet excitons, unlike singlet excitons, typically cannot undergo radiative decay and hence do not emit light except at very low temperatures. Theoretical considerations dictate that triplet excitons are formed about three times as often as singlet excitons. Thus the formation of triplet excitons, represents a fundamental limitation on efficiency in organic light emitting devices which are typically operated at or near ambient temperature. Polymers according to the present invention may serve as precursors to light emissive, short-lived excited state species that form as the normally unproductive triplet excitons encounter and that transfer energy.

Other components, which may be present in an organic light-emitting device in addition to the anode, cathode and light emitting material, include hole injection layers, electron injection layers, and electron transport layers. During operation of an organic light-emitting device comprising an electron transport layer, the majority of charge carriers (i.e. holes and electrons) present in the electron transport layer are electrons and light emission can occur through recombination of holes and electrons present in the electron transport layer. Additional components, which may be present in an organic light-emitting device, include hole transport layers, hole transporting emission (emitting) layers, hole blocking layers and electron transporting emission (emitting) layers.

The organic electroluminescent layer is a layer within an organic light emitting device which when in operation contains a significant concentration of both electrons and holes and provides sites for exciton formation and light emission. A hole injection layer is a layer usually in contact with the anode, which promotes the injection of holes from the anode into the interior layers of the OLED; and an electron injection layer is a layer usually in contact with the cathode that promotes the injection of electrons from the cathode into the OLED. Neither the hole injection layer nor the electron transport layer need not be in contact with the cathode. Frequently the electron transport layer is not an efficient hole transporter and thus it serves to block holes migrating toward the cathode. An electron transport layer is a layer, which facilitates conduction of electrons from cathode to a charge recombination site. A hole transport layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. A electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square inch, as measured by a four-point probe technique. Indium tin oxide (ITO) is frequently used as the anode because it is substantially transparent to light transmission and thus facilitates the escape of light emitted from electroactive organic layer. Other materials, which may be utilized as the anode layer, include tin oxide, indium oxide, zinc oxide, indium zinc oxide, zinc indium tin oxide, antimony oxide, and mixtures thereof.

Materials suitable for use as the cathode include zero valent metals, which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

Materials suitable for use in hole injection layers include 3,4-ethylenedioxythiophene (PEDOT) and blends of PEDOT with polystyrene sulfonate (PSS), commercially available from H.C. Stark, Inc. under the BAYTRON® tradename, and polymers based on a thieno[3,4b]thiophene (TT) monomer, commercially available from Air Products Corporation.

Materials suitable for use in hole transporting layers include 1,1-bis((di-4-tolylamino)phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylene dioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use as the electron transport layer include poly(9,9-dioctyl fluorene), tris(8-hydroxyquinolato) aluminum (Alq3), 2,9-dimethyl-4,7-diphenyl-1,1-phenanthroline, 4,7-diphenyl-1,10-phenanthroline, 2-(4-biphenylyl)-5-(4-t-butyl phenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

EXAMPLES

General Procedure for Preparation of Fluorene Aldehyde Monomer

A preferred synthetic route for preparing the 2,7-dibromofluorenone starting material is described in CN 1634839 (Scheme 1). The procedure uses bromine in water and results in high conversion of fluorenone to the desired dibromo product with little to no formation of mono-brominated species and unknown side-products are virtually absent. These under-brominated and unknown products are typically present in substantially higher quantities when fluorenone is brominated using a method that employs N-bromosuccinimde in methanesulfonic acid.

Scheme 1

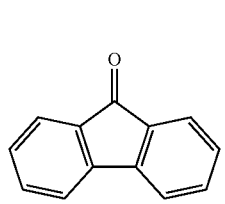

After three crystallizations of a scaled-up reaction, 150 g of high quality 2,7-dibromofluorenone (>99.8% purity, LC analysis) ready to be used in subsequent reactions was obtained. A portion of the 2,7-dibromofluorenone was converted into tosylated ethylene glycol 9,9'-disubstituted fluorene (5) in four steps (Scheme 2).

Scheme 2

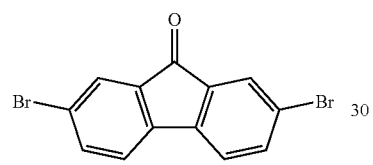

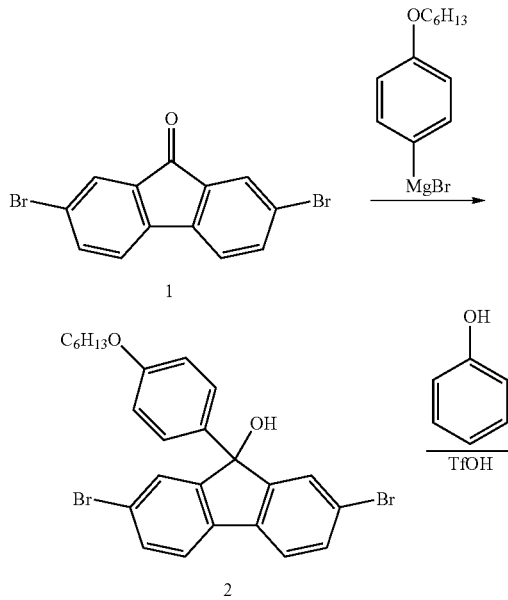

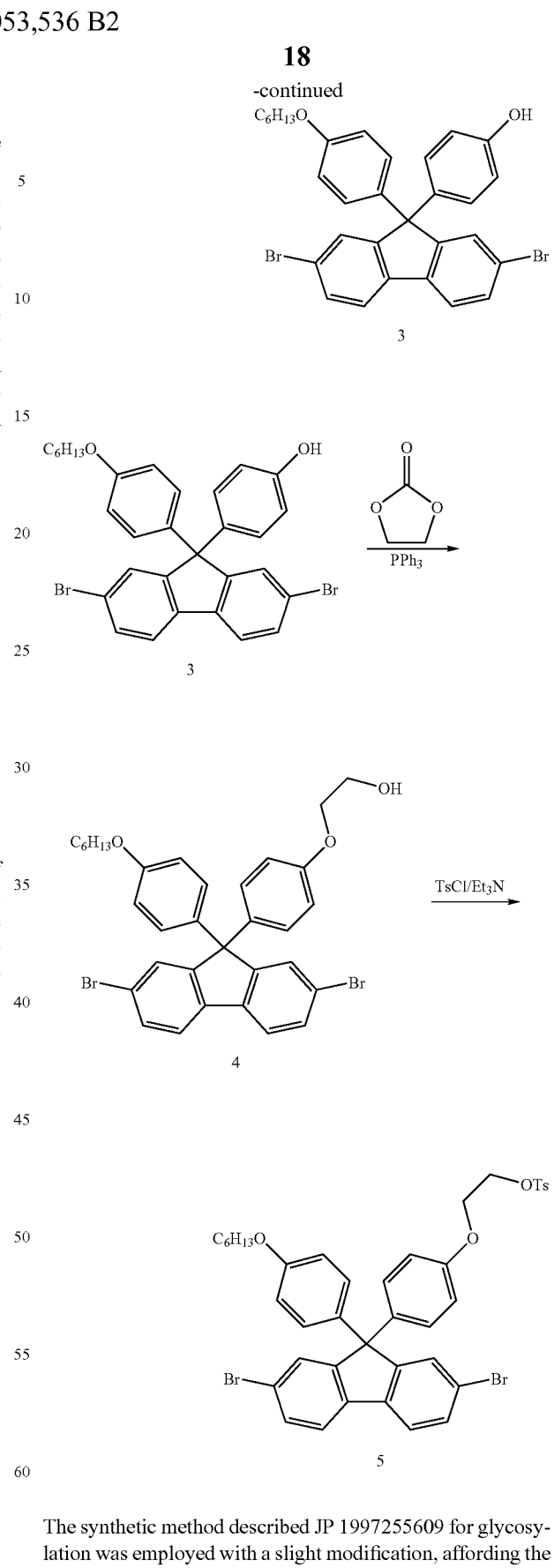

The synthetic method described JP 1997255609 for glycosylation was employed with a slight modification, affording the desired fluorene 4 in high conversion (95%) at substantially shorter reaction times (12 hours) and under neutral conditions.

The tosylated fluorene monomers (5) may be used in the preparation of the fluorene aldehyde monomer 7 for investigations of post-polymer modifications employing dynamic covalent chemistry (Scheme 3).

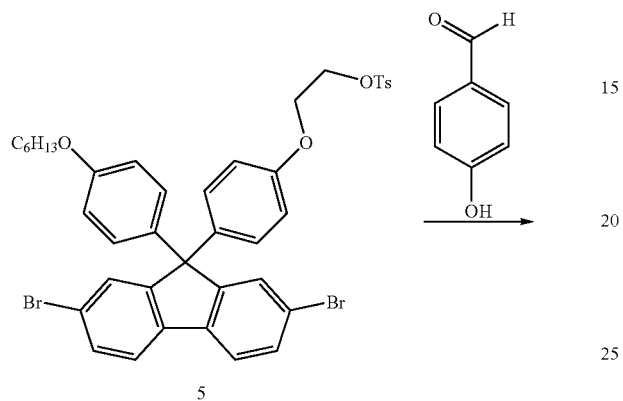

Scheme 3

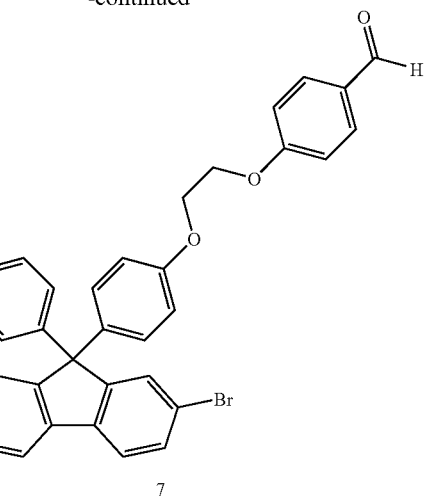

The target pendant polyfluorene containing 37.5% of an aromatic aldehyde substituent was prepared by the condensation of the two dibromides 7 and 9 with the bis-borate ester 8 under Suzuki-catalyzed condition in the presence of a hindered phosphine ligand PCy-Biphen (Scheme 5). The polyfluorene material had a significantly high molecular weight (Mw=1.04×107 and Mn=4.73×106) and a typical dispersivity (Mw/Mw=2.19) expected for a condensation polymer prepared under Suzuki conditions as assessed by gel permeation chromatography (GPC)

Scheme 4
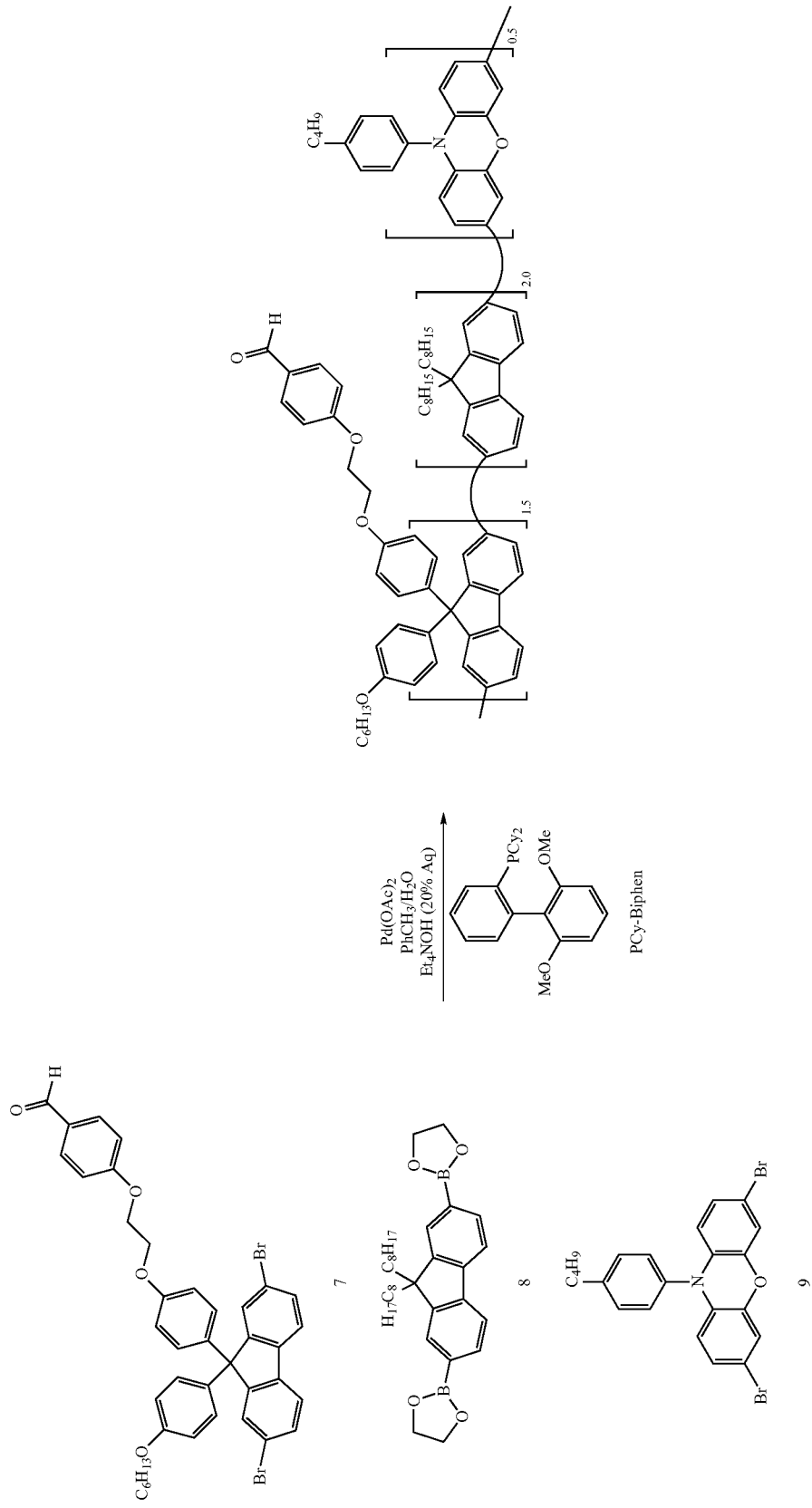

The viability of post-polymer modification was tested by preparing two pendant benzylamine functionalized polyfluorenes following the two-step procedure of (1) imine condensation followed by (2) subsequent reduction using NaBH$_4$ (Scheme 5).
Scheme 5
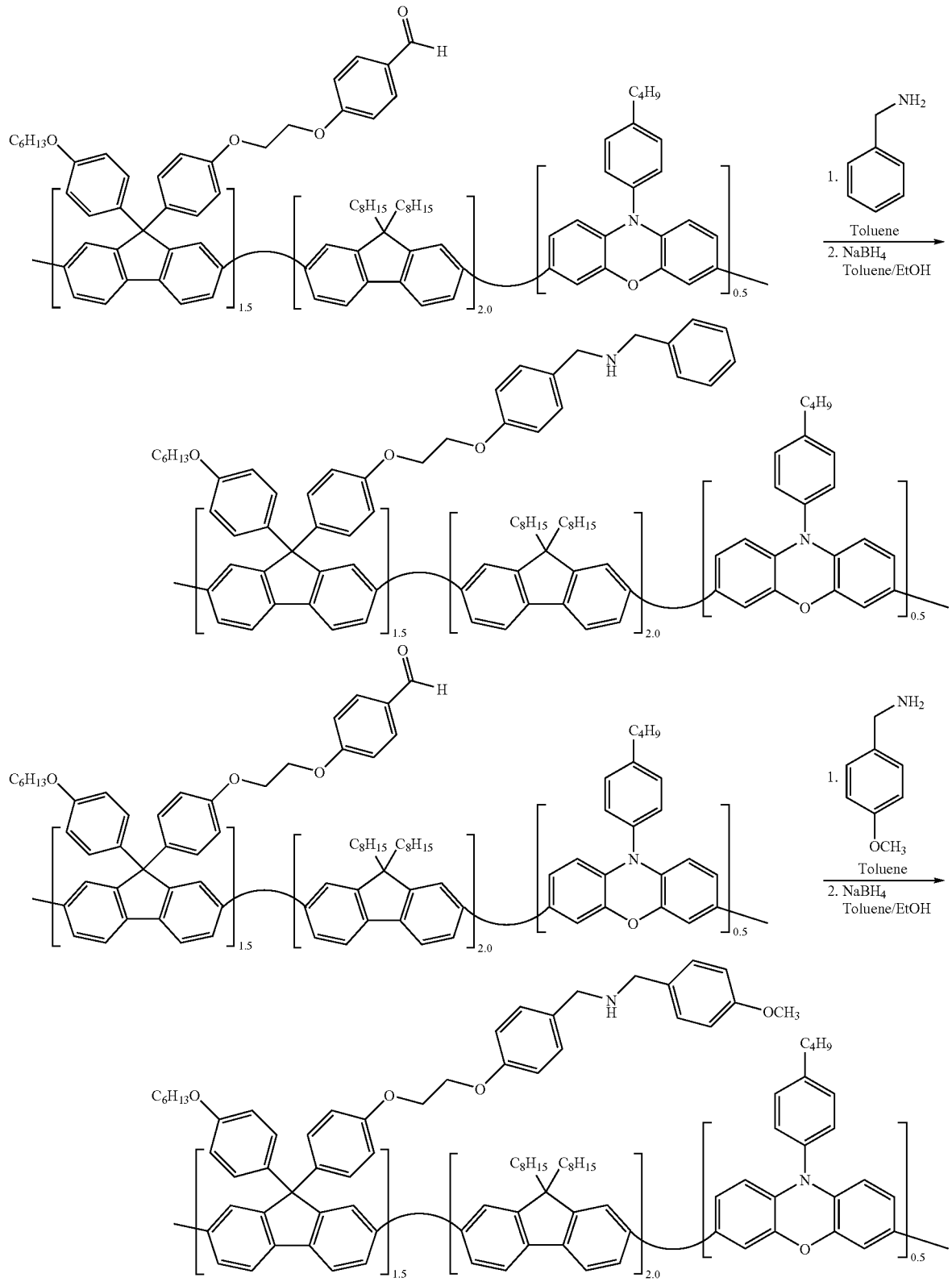

A sample of the parent polyfluorene material was reduced separately with NaBH$_4$ (Scheme 6) and used as a standard for the determination of the percent incorporation of two different benzyl amines using $^1$H NMR spectroscopy.

Scheme 6

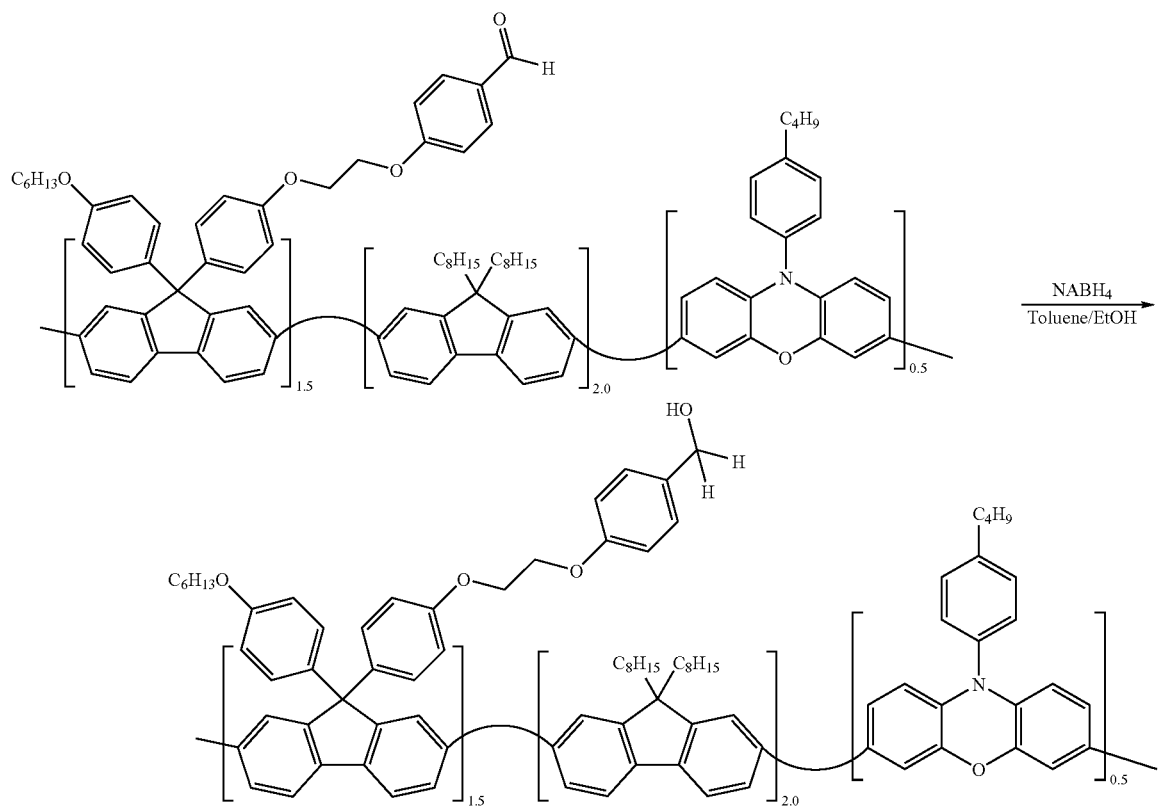

Investigations using $^1$H NMR spectroscopy revealed that the benzylamines were introduced at a portion of pendant sites of the polyfluorene. Closer inspection revealed that 60% (benzylamine) and 70% (4-methoxybenzylamine) of the available aromatic aldehyde substituents had condensed with these two benzylamines and were subsequently reduced to give a mixture corresponding secondary amine and benzyl alcohol as pendant side-chains As shown in FIG. 1 the 1H NMR spectra (500 MHz) may be used to distinguish the various products. The parent polyfluorene product containing pendant aldehydes is recorded in the bottom spectra (A trace, recorded in CD$_2$Cl$_2$), the fully reduced polyfluorene product containing pendant benzylalcohols is shown next (B trace, recorded in 10% MeOD/CD$_2$Cl$_2$) followed by the two polyfluorene products obtained from post-polymeric modification employing dynamic covalent chemistry (DCC) and subsequent reductions to prepare functional polyfluorene materials bearing benzylamine (C trace, recorded in 10% MeOD/CD$_2$Cl$_2$) and 4-methoxybenzylamine (D trace, recorded in 10% MeOD/CD$_2$Cl$_2$) substituents. The symbols correspond to the methylene proton resonance for the ethylene glycol moiety (†=ArOCH$_2$CH$_2$OAr), for the hexyloxy moiety (*=ArOCH$_2$CH$_2$CH$_2$CH$_2$CH$_2$CH$_2$), for the benzylic moiety (‡=HOCH$_2$PH), and for the secondary amine region (§=ArCH$_2$NHCH$_2$Ar).

General Procedure for Preparation of Fluorene Amine Monomer

In an alternative approach for the same process described above pendant primary amines are located on the backbone of a polyfluorene polymer and are reacted with a suitable aldehyde to give the imine intermediate.

The tosylated fluorene (5) as described in Scheme 3 can be employed to prepare the corresponding pendant amine fluorene monomers 7a and 7b.

Scheme 7.

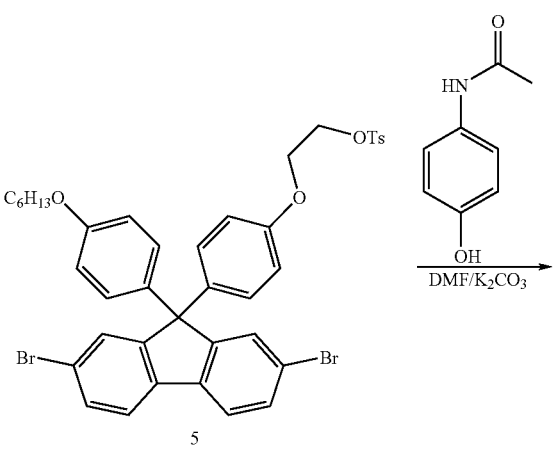

5

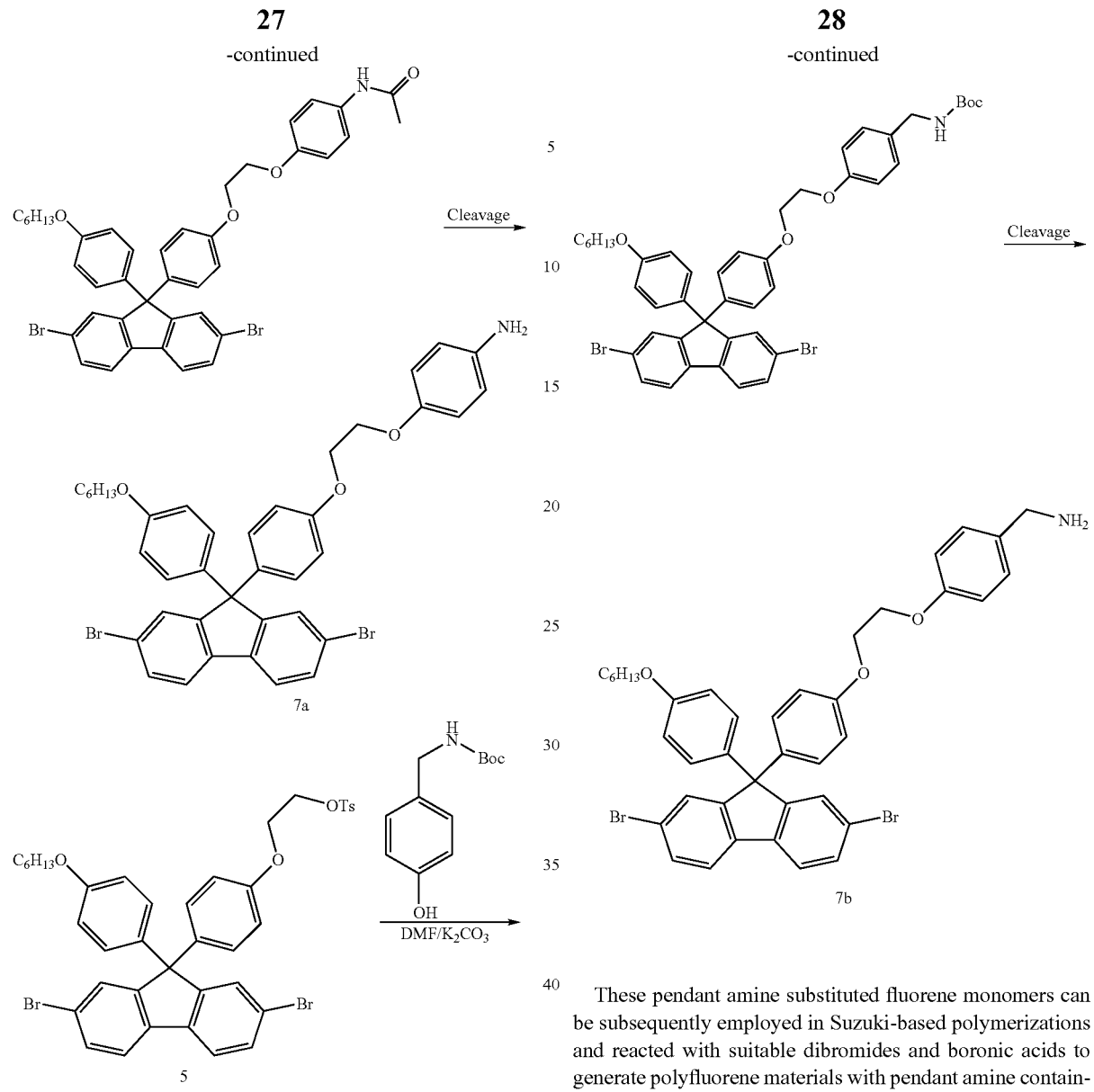
These pendant amine substituted fluorene monomers can be subsequently employed in Suzuki-based polymerizations and reacted with suitable dibromides and boronic acids to generate polyfluorene materials with pendant amine containing substituents (Scheme 8).

Scheme 8
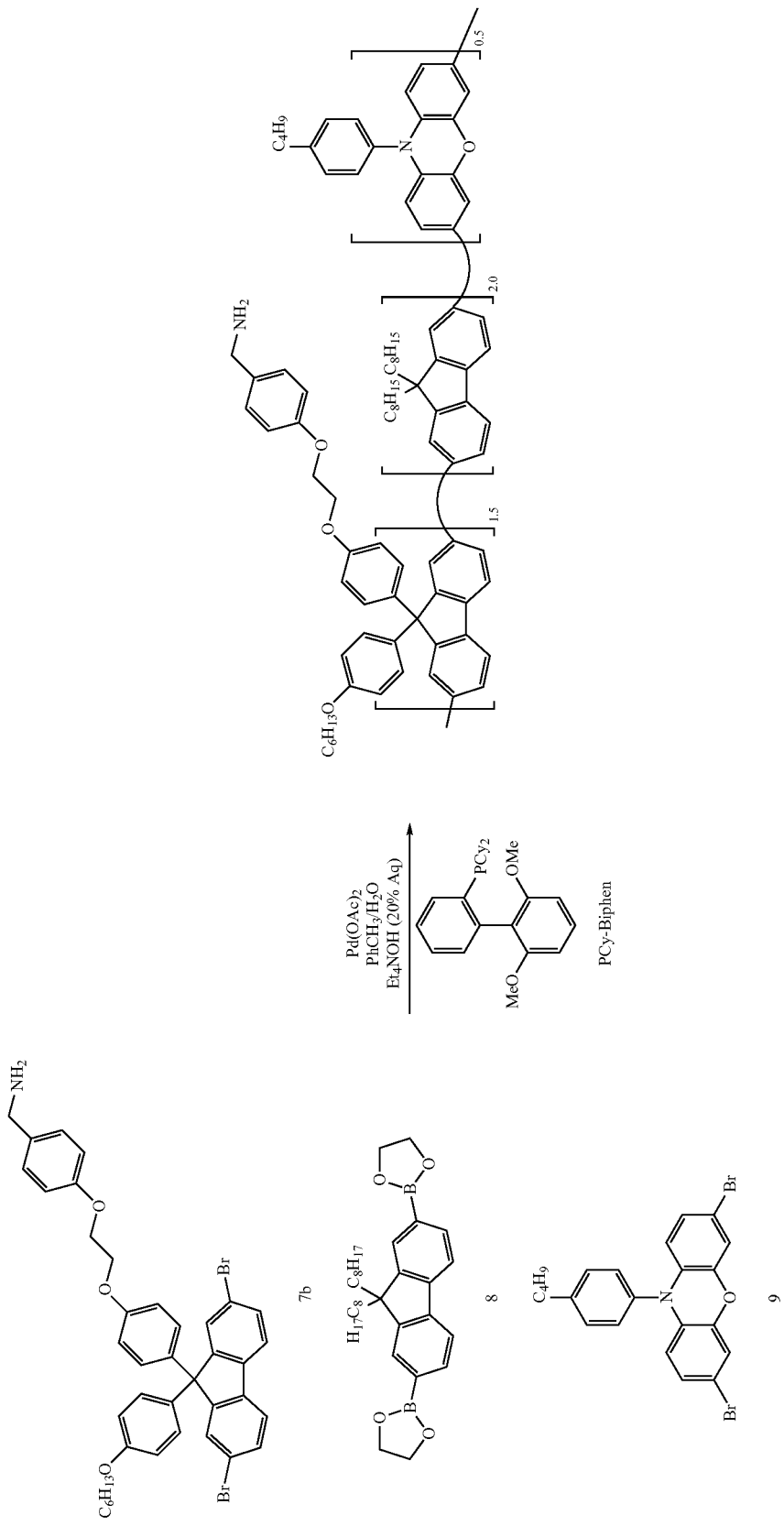

In a similar manner already described for polyfluorenes with pendant aldehydes, these pendant primary amine polyfluorenes can be converted into secondary amines by employing the two-step post-polymer modification procedure, which includes (1) imine condensation with a suitable aldehyde followed by (2) subsequent reduction using NaBH$_4$ (Scheme 9). The aldehyde species can also be a modified Ir(III) complex as shown by the example in Scheme 10 and the like.

Scheme 9

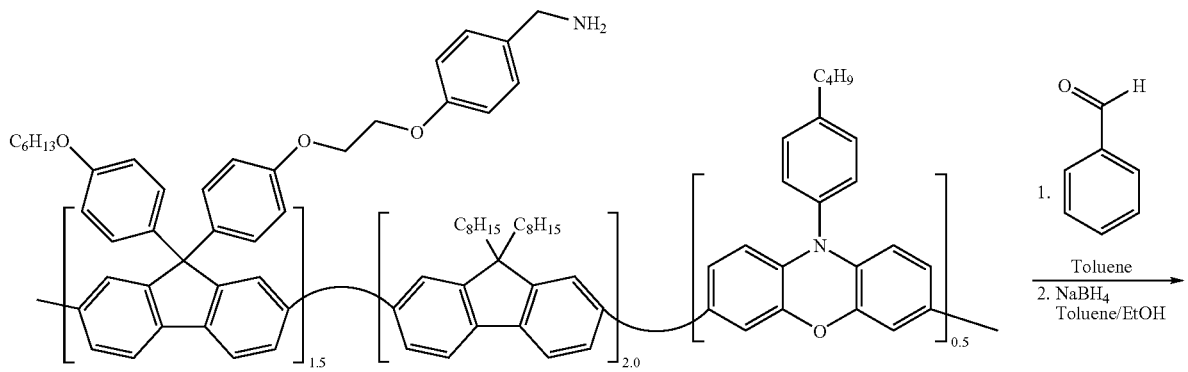

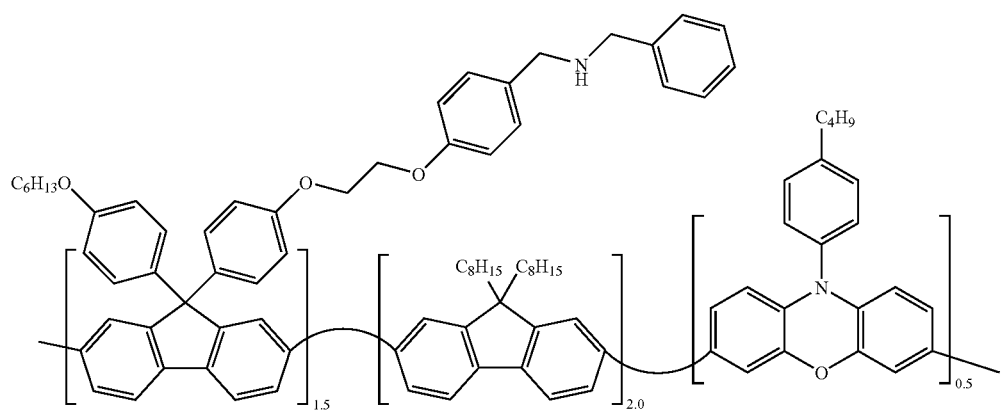

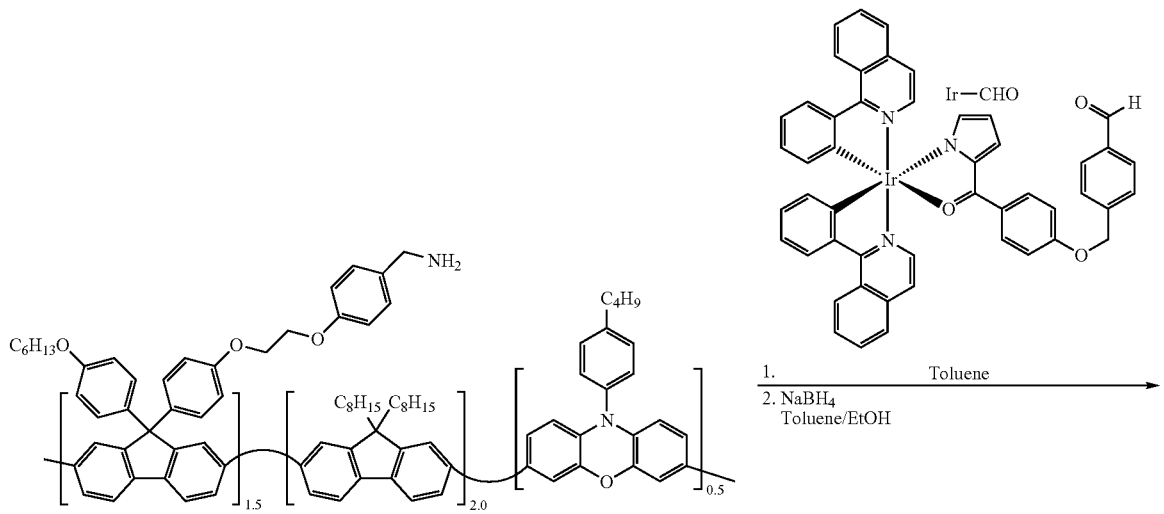

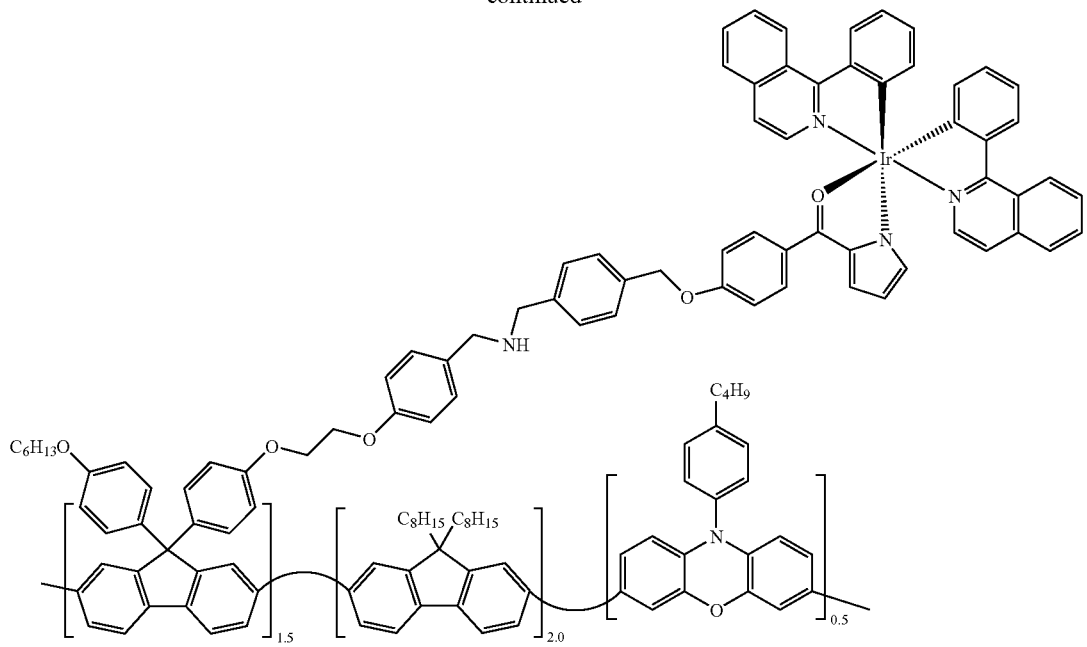

Scheme 10.

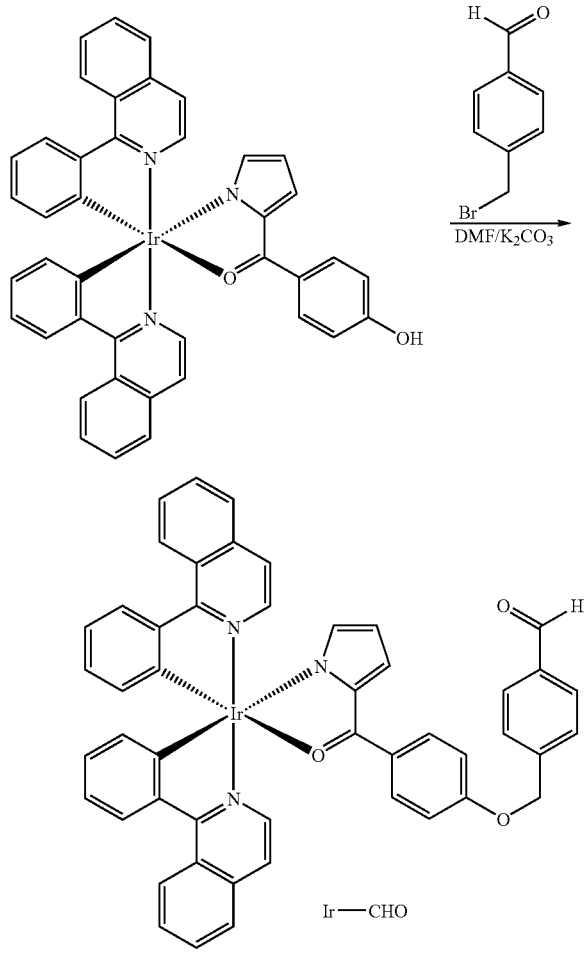

EXPERIMENTAL

Example 1

Synthesis of 9-(4-Hexyloxyphenyl)-9H-fluoren-9-ol (2)

Bromo-(4-hexyloxy)-benzene was prepared by alkylation of 4-bromophenol (91.2 g, 527 mmol) with bromohexane (86.0 g, 520 mmol), $K_2CO_3$ (80.0 g, 580 mmol) in acetone (200 mL) at reflux for 12 h. After removal the salts by filtration, the reaction mixture was concentrated to dryness to give an oil. The oil was dissolved in EtOAc (100 mL) and transferred to a separatory funnel and washed with 5% NaOH (4×200 mL). An additional 200 mL volume of EtOAc was added to the separatory funnel and the contents were washed with $NaHCO_3$ (1×200 mL) and finally dried over $MgSO_4$. Removal of the EtOAc solvents afforded a light yellow oil and was used without further purification. Yield: 119 g, 89%. $^1$H NMR (500 MHz, $CD_2Cl_2$, 25° C.) δ 0.91 (t, 3H), 1.34 (m, 4H), 1.45 (m, 2H), 1.76 (m, 2H), 3.92 (t, 2H), 6.79 (d, 2H), 7.36 (d, 2H). A dry 250 mL three-neck flask was charged with small Mg turnings (2.80 g,118 mmol) followed by anhydrous THF (100 mL). A few iodine crystals were added and the heterogeneous mixture was heated at reflux for 15 min and then cooled to room temperature. Stirring was stopped and 1,2-diromoethane (0.25 mL) was added to the reaction vessel. After 5 min elapsed an exothermic reaction ensued and stirring was resumed for 20 min. The reaction was then cooled to 20° C. and bromo-(4-hexyloxy)-benzene (27.8 g, 108 mmol) was added over a period of an hour while keeping the temperature between 14-18° C. The cooling bath was removed and the reaction was stirred for an additional 10 min as the temperature of the reaction rose to 28° C. The reaction was cooled to room temperature and the contents were transferred by pipette to a stirred toluene (250 mL) suspension of 2,7,-dibromofluorenone (30.0 g, 90.4 mmol) that was maintained at −10° C. with a cooling bath. The cooling bath was removed and the reaction mixture was stirred at room temperature for 20 min and subsequently treated with 20 mL of EtOH and a saturated solution of NH$_4$Cl (5 mL). The reaction mixture was filtered to remove insoluble materials and transferred to a separatory funnel containing EtOAc (100 mL) and H$_2$O (100 mL). The layers were separated and the organic layer was washed with H$_2$O (2×100 mL), brine (1×100 mL), and dried over MgSO$_4$. The solvents were removed to dryness to give a crude yellow solid (50.8 g). The crude material was recrystallized from Hexanes/CH$_2$Cl$_2$ to afford the product as an off-white microcrystalline material. Yield: 38.6 g, 79%. $^1$H NMR (500 MHz, CD$_2$Cl$_2$, 25° C.) δ 0.91 (t, 3H), 1.32 (m, 4H), 1.41 (m, 2H), 1.74 (m, 2H), 2.66 (s, 1H), 3.92 (t, 2H), 6.79 (d, 2H), 7.23 (d, 2H), 7.43 (d, 2H), 7.52 (m, 4H).

Example 2

Synthesis of 9-(4-Hexyloxyphenyl)-9'-(4-hydroxyphenyl)-fluorene (3)

A CH$_2$Cl$_2$ (75 mL) solution of phenol (24 g, 256 mmol) and 9-(4-hexyloxyphenyl) -9H-Fluoren-9-ol (2) (30.0 g, 55.7 mmol) was treated with 20 drops of methanesulfonic acid, which caused the solution to change to purple in color. The reaction was stirred at room temperature until TLC analysis indicated that the starting fluorenol was consumed. The reaction mixture was transferred to a separatory funnel and washed with a saturated solution of NaHCO$_3$ (1×200 mL), H$_2$O (3×150 mL), and then the organic layer was dried over MgSO$_4$. The solvents were removed to dryness to give an oil. The oil was adsorbed onto silica gel from a CH$_2$Cl$_2$ solution and the solvents were removed to dryness. The dried silica gel was transferred to the top of a glass-fritted funnel (500 mL) containing a packed H$_2$O slurry of silica gel (200 mL) fitted on top a vacuum flask. The contents of the funnel were flushed with H$_2$O by applying vacuum to the flask, which eluted phenol from the silica gel. After excess phenol was removed, the product was eluted from the silica gel with CH$_3$CN. The solvents were removed using a rotary evaporator with a bath at 45° C., which resulted in the formation of a milky solution from which a white solid formed. The product was collected by filtration, washed with water and dried. Isolated as a mixture (96:10) of para- and ortho-isomers of the hydroxyphenol adduct. Yield: 34.0 g, 98%. $^1$H NMR (500 MHz, CD$_2$Cl$_2$, 25° C.) δ 0.89 (t, 3H), 1.32 (m, 4H), 1.43 (m, 2H), 1.74 (m, 2H), 3.91 (t, 2H), 4.90 (s, 1H), 6.72 (d, 2H), 6.77 (d, 2H), 7.01 (d, 2H), 7.04 (d, 2H), 7.47 (d, 2H), 7.50 (d, 2H), 7.63 (d, 2H).

Example 3

Synthesis of 9-(4-Hexyloxyphenyl)-9'-(4-(2-hydroxyethoxy) phenyl)-fluorene (4)

The phenol 3 (33.0 g, 53.7 mmol) was dissolved in xylenes (30 mL), dried over MgSO$_4$, and filtered. The solution was concentrated on a rotary evaporator until the contents of the flask weighed 70 g. The xylenes solution of 3 was then placed under an inert atmosphere of N$_2$ and treated with ethylene carbonate (3.9 mL, 59.0 mmol) which was then heated at reflux for 15 h. After this time had passed, the reaction was cooled to room temperature and the solvents were removed to give a yellow oil. The oil was chromatographed through 2 L of SiO$_2$ and eluted with CH$_2$Cl$_2$. The product was isolated as a colorless oil after removal of the solvents. Yield 29.1 g, 82%. $^1$H NMR (500 MHz, CD$_2$Cl$_2$, 25° C.) δ 0.94 (t, 3H), 1.36 (m, 4H), 1.47 (m, 2H), 1.78 (m, 2H), 2.03 (t, 1H), 3.94 (m, 4H), 4.07 (t, 2H), 6.81 (d, 2H), 6.85 (d, 2H), 7.08 (d, 2H), 7.11 (d, 2H), 7.52 (d, 2H), 7.54 (d, 2H), 7.67 (d, 2H).

Example 4

Synthesis of 9-(4-Hexyloxyphenyl)-9'-(4-(2-p-toluenesulfonylethoxy)phenyl)-fluorene (5)

A toluene solution (200 mL) of the ethylene glycol 4 (29.1 g, 44.2 mmol) was treated with p-toluenesulfonyl chloride (13.3 g, 69.8 mmol) and triethylamine (19.4 mL, 140 mmol) and stirred at room temperature for 60 h under an inert atmosphere of N2. The reaction mixture was then filtered to remove triethylamine hydrochloride and concentrated to dryness. The residue was dissolved in EtOAc and washed with 5% HCl (1×100 mL), saturated NaHCO$_3$ (2×200 mL), dried over MgSO4, and the solvents were removed to dryness. The crude oil was chromatographed through 1.4 L of SiO$_2$ (CH$_2$Cl$_2$:Hexanes, 1:1). The product was isolated as a white amorphous solid after removal of the solvents. Yield 33.0 g, 92%. $^1$H NMR (500 MHz, CD$_2$Cl$_2$, 25° C.) δ 0.88 (t, 3H), 1.33 (m, 4H), 1.43 (m, 2H), 1.74 (m, 2H), 2.41 (s, 3H), 3.91 (t, 2H), 4.09 (t, 2H), 4.31 (t, 2H), 6.68 (d, 2H), 6.77 (d, 2H), 7.03 (m, 4H), 7.34 (d, 2H), 7.46 (d, 2H), 7.50 (d, 2H), 7.63 (d, 2H), 7.78 (d, 2H).

Example 5

Synthesis of 9-(4-Hexyloxyphenyl)-9'-(4-(4-(2-ethoxy)-benzaldehyde)phenyl)-fluorene (7)

A stirred DMF solution (15 mL) containing the tosylated fluorene 5 (4.30 g, 5.76 mmol), 4-hydroxybenzaldehyde (1.10 g, 8.63 mmol), and K$_2$CO$_3$ (1.70 g, 12.0 mmol) was heated at 80° C. The tosylated fluorene was consumed after 2 h as evidenced by TLC (EtOAc:Hexanes, 1:9). The reaction was cooled and H$_2$O (100 mL) followed by EtOAc (150 mL) and layers were separated after the contents were transferred to a separatory funnel. The organic layer was washed with 5% NaOH (2×100 mL), brine (1×100 mL), and dried over MgSO$_4$. The solvents were removed to dryness to give a light-pink colored solid (3.80 g). The product was adsorbed on to SiO$_2$ and chromatographed through SiO2 (EtOAc: Hexanes, gradient 1:20 to 1:9) and isolated as a white solid after removal of the solvents. Yield 3.40 g, 77%. $^1$H NMR (400 MHz, CD2Cl2, 25° C.) δ 0.87 (t, 3H), 1.32 (m, 4H), 1.42 (m, 2H), 1.75 (m, 2H), 3.90 (t, 2H), 4.31 (m, 2H), 4.38 (m, 2H), 6.77 (d, 2H), 6.83 (d, 2H), 7.05 (m, 6H), 7.49 (m, 4H), 7.63 (d, 2H), 7.83 (d, 2H), 9.87 (s, 1H).

Scheme 11
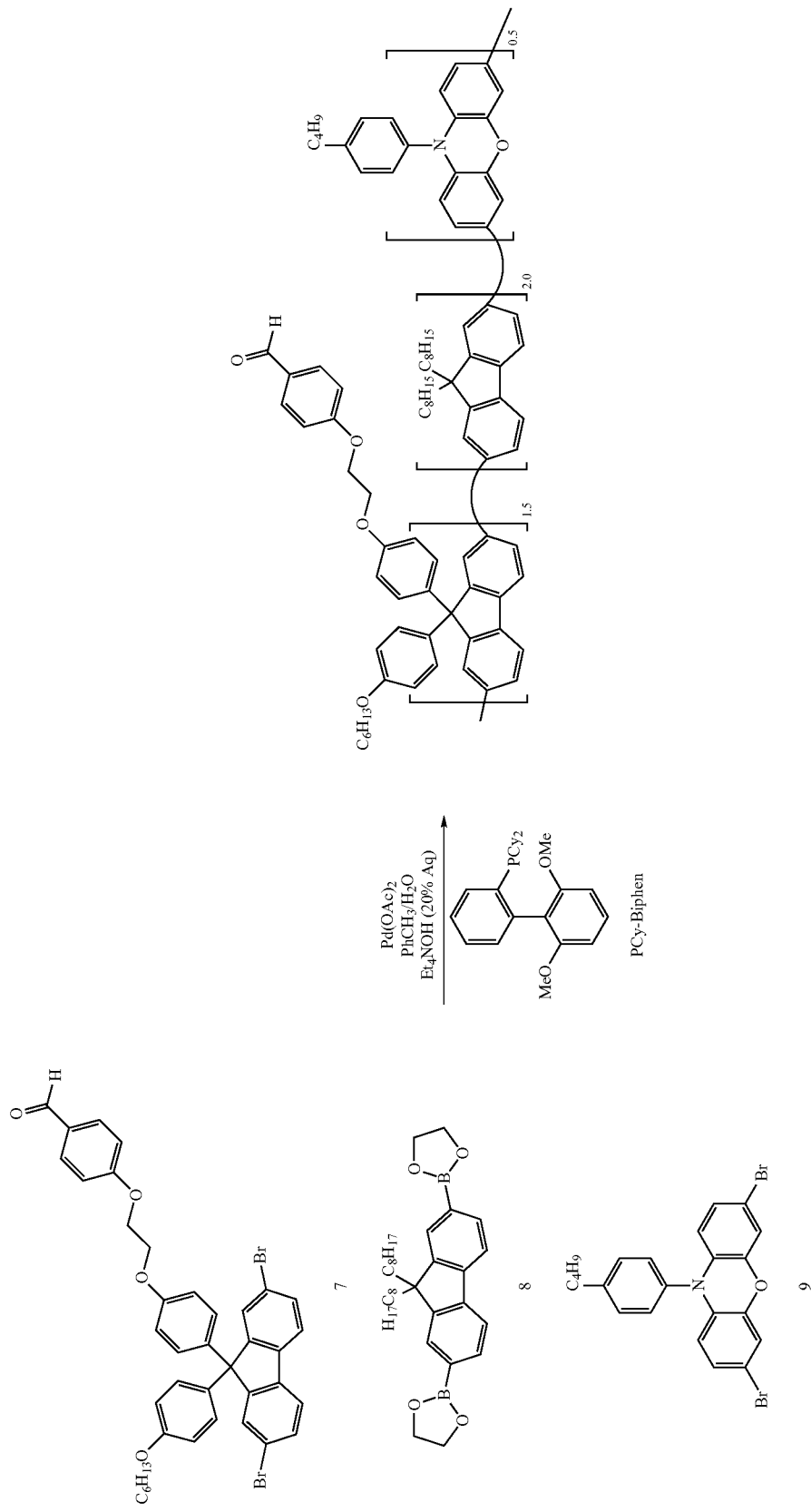

TABLE 1

Preparation of Pendant Benzaldehyde Polyfluorene

| | Compound | | | | | | |
|---|---|---|---|---|---|---|---|
| | F8-bisborate | HOFALD-$BR_2$ | POZ-$Br_2$ | $Pd(OAc)_2$ | PCy-Biphen | $Et_4NOH$ (20% Aq) | $H_2O$ |
| MW | 530.35 | 762.44 | 473.20 | 224.51 | 410.53 | 147.26 | |
| mmol | 2.41 | 1.81 | 0.6 | 0.04 | 0.13 | 12.07 | |
| mg | 1278.1 | 1380.0 | 283.9 | 8.1 | 52.5 | 8887.1 | 8.89 g $PhCH_3$ 50 mL |

Example 6

Preparation of Pendant Benzaldehyde Polyfluorene

A 150 ml three-neck flask with a nitrogen inlet to a bubbler and a magnetic stirrer was charged with all the monomers, PCy-Biphen and toluene (45 mL). This solution is degassed with nitrogen for 5-10 minutes then $Pd(OAc)_2$ is added using the remaining toluene to rinse any $Pd(OAc)_2$ adhering to the walls of the flask. Simultaneously in an addition funnel fitted to the three-neck flask, the aqueous components are degassed with nitrogen. After at least 20 minutes of degassing, the aqueous components were added to the organic solution and the flask was immersed in a sand bath at 80° C. The biphasic reaction mixture was heated under a positive pressure of nitrogen for 20 hrs after which point the solution was cooled to room temperature. The contents of the reaction vessel were transferred to a blender containing MeOH (500 mL) and blended for 5 min. The polymer was collected by filtration, washed with methanol and dried under vacuum overnight. Yield 2.26g (55%). Gel permeation chromatography indicated Mw=1.04×107 and Mn=4.73×106 (Mw/Mw=2.19) relative to polystyrene standards.

Example 7

Preparation of Pendant Benzylamine Polyfluorene

The pendant benzaldehyde polyfluorene (0.500 g) was dissolved in toluene (100 mL) and treated with benzylamine (0.500 mL, 4.58 mmol). The solvents were removed under reduced pressure using a rotary evaporator. The addition and removal of fresh toluene (100 mL) was repeated two additional times. After the last removal of toluene, the polymer residue was dissolved in THF (20 mL) and EtOH (2 mL) was added as a co-solvent. To this solution was added $NaBH_4$ (300 mg, 7.93 mmol) and the reaction mixture was stirred at room temperature for 2 hrs. The solution changed color from yellow to yellow-brown. The reaction mixture was treated with AcOH (20 drops) and stirring was continued until the evolution of gases subsided. The solvents were removed and the polymeric residue was dissolved in the minimum amount of toluene. The toluene solution was poured into a blender containing MeOH (400 mL) causing the polymer to precipitate from solution as a fine powder. The product was collected by filtration and washed briefly with MeOH. The solid material was dissolved in toluene (30 mL) and passed through a short column of $SiO_2$ (25 mL) equilibrated with toluene. After eluting with toluene the first major yellow fraction was collected, concentrated to 50 mL and precipitated from MeOH (500 mL) in a blender as a fine powder. The polymer was collected by filtration and washed with MeOH. Dried in vacuum at room temperature. Yield 320 mg.

Example 8

Preparation of Pendant 4-Methoxybenzylamine Polyfluorene

The pendant benzaldehyde polyfluorene (0.500 g) was dissolved in toluene (100 mL) and treated with 4-methoxybenzylamine (0.500 mL, 3.83 mmol). The solvents were removed under reduced pressure using a rotary evaporator. The addition and removal of fresh toluene (100 mL) was repeated three additional times. After the last removal of toluene, the polymer residue was dissolved in toluene (50 mL) and EtOH (5 mL) was added as a co-solvent. To this solution was added $NaBH_4$ (500 mg, 13.2 mmol) and the reaction mixture was stirred at room temperature. After 20 mins the solution changed color from yellow to yellow-brown. The reaction mixture was heated at reflux for 1 h after which the solution cooled to room temperature. The reaction mixture was treated with 80% EtOH (20 mL) and transferred to a blender containing MeOH (500 mL) causing the polymer to precipitate from solution as a fine powder. The product was collected by filtration and washed briefly with MeOH and dried under vacuum at room temperature. The solid material (0.502 g) was dissolved in 10% $MeOH/CH_2Cl_2$ (20 mL) and vacuum filtered through glass fiber filter paper into MeOH (500 mL) with stirring. The polymer precipitated from solution as yellow stringy fibers and was collected by filtration and washed with MeOH. Dried in vacuum at room temperature. Yield 446 mg.

Example 9

Preparation of Pendant Benzylalcohol Polyfluorene

The pendant benzaldehyde polyfluorene (0.500 g) was dissolved in 10% EtOH/Toluene (11 mL) and treated with $NaBH_4$ (250 mg, 6.60 mmol) and the reaction mixture was stirred at room temperature. After 20 mins the solution changed color from yellow to yellow-brown. The reaction mixture was heated at reflux for 1 h after which the solution cooled to room temperature. The reaction mixture was treated with AcOH (1 mL) drop wise and stirring was continued until the evolution of gases subsided. The contents were transferred to a blender containing MeOH (500 mL) causing the polymer to precipitate from solution. The product was collected by filtration, washed briefly with MeOH and partially dried in air. The solid material was dissolved in 10% $MeOH/CH_2Cl_2$ (20 mL) and vacuum filtered through glass fiber filter paper into MeOH (500 mL) with stirring. The polymer precipitated from solution as yellow-green stringy fibers and was collected by filtration and washed with MeOH. Dried in vacuum at room temperature. Yield 219 mg.

Example 10

Synthesis 9-(4-Hexyloxyphenyl)-9'-(4-(4-(2-ethoxy)-aminobenzene) phenyl)-fluorene (7a)

A stirred DMF solution (15 mL) containing the tosylated fluorene 5 (4.30 g, 5.76 mmol), 4-hydroxy-acetanilide (8.63 mmol), and $K_2CO_3$ (1.70 g, 12.0 mmol) are heated at 80° C. The progress of the reaction is monitored by thin layer chromatography (TLC). The reaction is cooled and $H_2O$ (100 mL) followed by EtOAc (150 mL) and layers are separated after the contents are transferred to a separatory funnel. The organic layer is washed with 5% NaOH (2×100 mL), brine (1×100 mL), and dried over $MgSO_4$. The solvents are removed to dryness to give the crude residue. The product is purified by column chromatography through $SiO_2$.

Example 11

Synthesis 9-(4-Hexyloxyphenyl)-9'-(4-(4-(2-ethoxy)-aminomethylbenzene)phenyl)-fluorene (7b)

A stirred DMF solution (15 mL) containing the tosylated fluorene 5 (4.30 g, 5.76 mmol), N-Boc-4-hydroxy-benzylamine (8.63 mmol), and $K_2CO_3$ (1.70 g, 12.0 mmol) are heated at 80° C. The progress of the reaction is monitored by thin layer chromatography (TLC). The reaction is cooled and $H_2O$ (100 mL) followed by EtOAc (150 mL) and layers are separated after the contents are transferred to a separatory funnel. The organic layer is washed with 5% NaOH (2×100 mL), brine (1×100 mL), and dried over $MgSO_4$. The solvents are removed to dryness to give the crude residue. The product is purified by column chromatography through $SiO_2$. T

Example 12

Preparation of Pendant Benzylamine Polyfluorene

Scheme 12
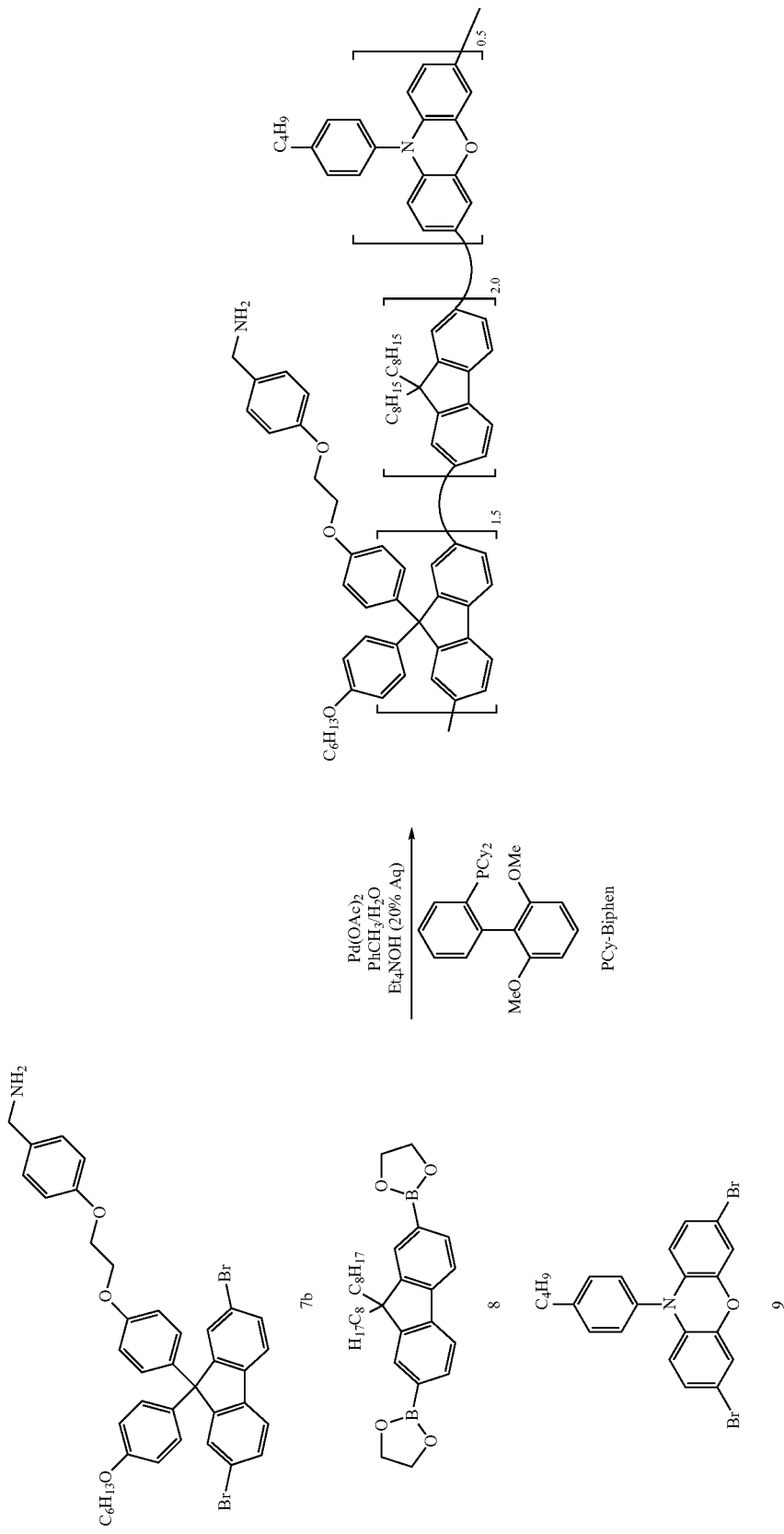

TABLE 2

Preparation of Pendant Benzylamine Polyfluorene

| | \multicolumn{7}{c}{Compound} | | | | | | |
|---|---|---|---|---|---|---|---|
| | 8 | 7b | 9 | Pd(OAc)2 | PCy-Biphen | Et4NOH (20% Aq) | H20 |
| MW | 530.35 | 763.47 | 473.20 | 224.51 | 410.53 | 147.26 | |
| mmol | 2.41 | 1.81 | 0.6 | 0.04 | 0.13 | 12.07 | |
| mg | 1278.1 | 1381.8 | 283.9 | 8.1 | 52.5 | 8887.1 | 8.89 g PhCH3 50 mL |

A 150 ml three-neck flask with a nitrogen inlet to a bubbler and a magnetic stirrer is charged with all the monomers, PCy-Biphen and toluene (45 mL). This solution is degassed with nitrogen for 5-10 minutes then Pd(OAc)$_2$ is added using the remaining toluene to rinse any Pd(OAc)$_2$ adhering to the walls of the flask. Simultaneously in an addition funnel fitted to the three-neck flask, the aqueous components are degassed with nitrogen. After at least 20 minutes of degassing, the aqueous components are added to the organic solution and the flask is immersed in a sand bath at 80° C. The biphasic reaction mixture is heated under a positive pressure of nitrogen for 20 hrs after which point the solution is cooled to room temperature. The contents of the reaction vessel are transferred to a blender containing MeOH (500 mL) and blended for 5 min. The polymer is collected by filtration, washed with methanol and dried under vacuum overnight.

Example 13

Preparation of Pendant Secondary Benzylamine Polyfluorene

The pendant benzylamine polyfluorene (0.500 g) is dissolved in toluene (100 mL) and treated with an benzaldehyde. The solvents are removed under reduced pressure using a rotary evaporator. The addition and removal of fresh tolulene (100 mL) is repeated two additional times. After the last removal of toluene, the polymer residue is dissolved in THF (20 mL) and EtOH (2 mL) is added as a co-solvent. To this solution is added NaBH$_4$ (300 mg, 7.93 mmol) and the reaction mixture is stirred at room temperature for 2 hrs. The reaction mixture is treated with AcOH (20 drops) and stirring is continued until the evolution of gases subsided. The solvents are removed and the polymeric residue is dissolved in the minimum amount of toluene. The toluene solution is poured into a blender containing MeOH (400 mL) causing the polymer to precipitate from solution as a fine powder. The product is collected by filtration and washed briefly with MeOH. The solid material is dissolved in toluene (30 mL) and passed through a short column of SiO$_2$ (25 mL) equilibrated with toluene. After eluting with toluene the first major yellow fraction is collected, concentrated to 50 mL and precipitated from MeOH (500 mL) in a blender as a fine powder. The polymer is collected by filtration and washed with MeOH. Dried in vacuum at room temperature.

Example 14

Preparation of Pendant Ir Complex Polyfluorene

The pendant benzylamine polyfluorene (0.500 g) is dissolved in toluene (100 mL) and treated with the aldehyde iridium complex Ir—CHO. The solvents are removed under reduced pressure using a rotary evaporator. The addition and removal of fresh tolulene (100 mL) is repeated three additional times. After the last removal of toluene, the polymer residue is dissolved in toluene (50 mL) and EtOH (5 mL) is added as a co-solvent. To this solution is added NaBH4 (500 mg, 13.2 mmol) and the reaction mixture is stirred at room temperature. The reaction mixture is treated with 80% EtOH (20 mL) and transferred to a blender containing MeOH (500 mL) causing the polymer to precipitate from solution. The product is collected by filtration and washed briefly with MeOH and dried under vacuum at room temperature.

Example 15

Preparation of Ir—CHO

A stirred DMF solution (15 mL) containing the 4-(bromomethyl)-benzaldehyde (1.2 mmol), the 2-(4-hydroxybenzoyl)-pyrrolo)Ir(piq)2 complex (1.0 mmol), and K$_2$CO$_3$ (0.85 g, 6.0 mmol) are heated at 80° C. The progress of the reaction is monitored by thin layer chromatography (TLC). The reaction is cooled and H$_2$O (100 mL) followed by EtOAc (150 mL) and layers are separated after the contents are transferred to a separatory funnel. The organic layer is washed with 5% NaOH (2×100 mL), brine (1×100 mL), and dried over MgSO$_4$. The solvents are removed to dryness to give the crude residue. The product is purified by column chromatography through SiO$_2$.

Equivalents

The invention may be embodied in other specific forms without departing from the spirit or essential characteristics thereof. The foregoing embodiments are therefore to be considered in all respects as illustrative rather than limiting on the invention described herein. The scope of the invention is thus indicated by the appended claims rather than by the foregoing description, and all changes that come within the meaning and range of equivalency of the claims are therefore intended to be embraced therein.

The invention claimed is:

1. A process comprising reacting a polyfluorene comprising at least one structural group of formula I

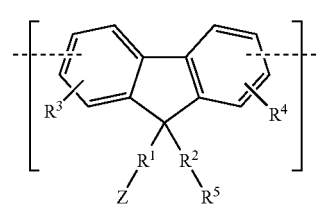

I with an iridium (III) compound of formula II

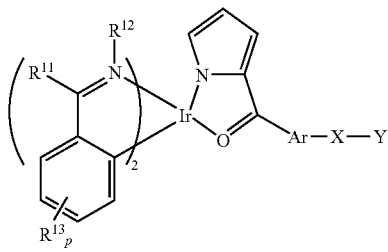

wherein
- $R^1$ and $R^2$ are independently alkyl, substituted alkyl, aryl, substituted aryl or a combination thereof;
- $R^5$ is H or CHO;
- $R^3$ and $R^4$ are independently hydrogen, alkyl, substituted alkyl, aryl, substituted aryl or a combination thereof;
- $R^{11}$ and $R^{12}$ taken together form a substituted or unsubstituted monocyclic or bicyclic heteroaromatic ring;
- $R^{13}$ is independently at each occurrence halo, nitro, hydroxy, amino, alkyl, aryl, arylalkyl, alkoxy, substituted alkoxy, substituted alkyl, substituted aryl, or substituted arylalkyl;
- Ar is aryl, heteroaryl, substituted aryl, substituted heteroaryl, or a combination thereof;
- X is a direct bond, alkyl, substituted alkyl, or a combination thereof;
- Y is CHO or $NH_2$;
- Z is CHO or $NH_2$ and does not equal Y; and
- p is 0, 1 or 2.

2. A process according to claim 1 wherein $R^{11}$ and $R^{12}$ taken together form a substituted or unsubstituted isoquinoline.

3. A process according to claim 1 wherein X is a direct bond.

4. A process according to claim 1 wherein $R^1$ is oxaalkyl, substituted oxaalkyl, or a combination thereof.

5. A process according to claim 4 wherein $R^1$ is

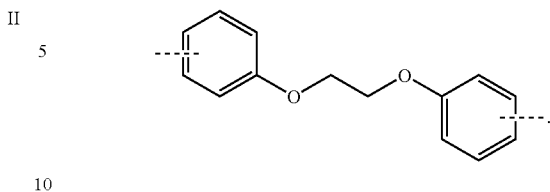

6. A process according to claim 1 further comprising reducing the reaction product of the polyfluorenes of formula I and the iridium (III) compound of formula II.

7. A process according to claim 6 wherein said reducing the reaction product comprises adding $NaBH_4$ to the reaction product.

8. A process according to claim 1 further comprising reacting the polyfluorenes of formula I with a triarylamine having a primary amino group in addition to the iridium (III) compound of formula II and wherein Z is CHO and Y is $NH_2$.

9. A process according to claim 8 further comprising reducing the reaction product of the polyfluorenes of formula I, the iridium (III) compound of formula II, and the triarylamine.

10. A process according to claim 9 wherein the said reducing the reaction product comprises adding $NaBH_4$ to the reaction product.

11. A process according to claim 8 wherein weight percentage of the iridium (III) compound of formula II relative to the triarylamine ranges from about 0.5 to about 50 mol %.

12. A process according to claim 1 further comprising reacting the polyfluorenes of formula I with a triarylamine having a CHO group in addition to the iridium (III) compound of formula II and wherein Z is $NH_2$ and Y is CHO.

13. A process according to claim 12 further comprising reducing the reaction product of the polyfluorenes of formula I, the iridium (III) compound of formula II, and the triarylamine.

14. A process according to claim 13 wherein the said reducing the reaction product comprises adding $NaBH_4$ to the reaction product.

15. A process according to claim 12 wherein weight percentage of the iridium (III) compound of formula II relative to the triarylamine ranges from about 0.5 to about 50 mol %.

* * * * *